(12) United States Patent
Geiger et al.

(10) Patent No.: US 12,520,563 B2
(45) Date of Patent: Jan. 6, 2026

(54) ISOLATION OF SEMICONDUCTOR DEVICES BY BURIED SEPARATION RAILS

(71) Applicant: Intel Corporation, Santa Clara, CA (US)

(72) Inventors: Richard Geiger, Munich (DE); Peter Baumgartner, Munich (DE); Alexander Bechtold, Bavaria (DE); Uwe Hodel, Putzbrunn (DE); Richard Hudeczek, Munich (DE); Walther Lutz, Erding (DE); Carla Moran Guizan, Munich (DE); Georgios Panagopoulos, Munich (DE); Johannes Xaver Rauh, Munich (DE); Roshini Sachithanandan, Bavaria (DE)

(73) Assignee: Intel Corporation, Santa Clara, CA (US)

( * ) Notice: Subject to any disclaimer, the term of this patent is extended or adjusted under 35 U.S.C. 154(b) by 872 days.

(21) Appl. No.: 17/554,061

(22) Filed: Dec. 17, 2021

(65) Prior Publication Data

US 2023/0197527 A1    Jun. 22, 2023

(51) Int. Cl.
*H10D 84/03* (2025.01)
*H01L 23/522* (2006.01)
(Continued)

(52) U.S. Cl.
CPC ....... *H10D 84/038* (2025.01); *H01L 23/5226* (2013.01); *H01L 23/5286* (2013.01);
(Continued)

(58) Field of Classification Search
CPC .... H10D 89/611; H10D 89/60; H10D 89/931; H01L 23/5286; H01L 23/60
See application file for complete search history.

(56) References Cited

U.S. PATENT DOCUMENTS 5,290,724 A * 3/1994 Leach ............... H10D 89/713
257/361
2017/0012032 A1 * 1/2017 Tomita ............... H10D 1/714
(Continued)

OTHER PUBLICATIONS

Gupta, Anshul et al "Buried Power Rail Integration with FinFETs for Ultimate CMOS Scaling", IEEE Transactions on Electron Devices, vol. 67, No. 12, Dec. 2020, pp. 54349-5354.
(Continued)

*Primary Examiner* — William B Partridge
*Assistant Examiner* — Alexandre X Ramirez
(74) *Attorney, Agent, or Firm* — Akona IP PC

(57) ABSTRACT

IC devices including semiconductor devices isolated by BSRs are disclosed. An example IC device includes a first and a second semiconductor devices, a support structure, and a BSR. The BSR defines boundaries of a first and second section in the support structure. At least a portion of the first semiconductor device is in the first section, and at least a portion of the second semiconductor device is in the second section. The first semiconductor device is isolated from the second semiconductor device by the BSR. Signals from the first semiconductor device would not be transmitted to the second semiconductor device through the support structure. The BSR may be connected to a TSV or be biased. The IC device may include additional BSRs to isolate the first and second semiconductor devices. An BSR may be a power rail used for delivering power.

10 Claims, 14 Drawing Sheets

(51) Int. Cl.
    *H01L 23/528*     (2006.01)
    *H01L 23/535*     (2006.01)
    *H01L 23/60*     (2006.01)
    *H10D 84/01*     (2025.01)
    *H10D 84/85*     (2025.01)
    *H10D 89/60*     (2025.01)

(52) U.S. Cl.
    CPC ............ *H01L 23/535* (2013.01); *H01L 23/60* (2013.01); *H10D 84/0186* (2025.01); *H10D 84/0193* (2025.01); *H10D 84/853* (2025.01); *H10D 89/60* (2025.01)

(56) References Cited

U.S. PATENT DOCUMENTS

| | | | |
|---|---|---|---|
| 2023/0064525 A1* | 3/2023 | Hsu ........................ | G06F 30/392 |
| 2023/0163020 A1* | 5/2023 | Grant ................ | H10D 84/0151 |
| | | | 257/382 |

OTHER PUBLICATIONS

Ambert, William J. et al, "Package Inductors for Intel Fully Integrated Voltage Regulators", IEEE Transactions on Components, Packaging and Manufacturing Technology, vol. 6, No. 1, Jan. 2016, pp. 3-11.

Prasad, Divya et al, "Buried Power Rails and Back-side Power Grids: Arm® CPU Power Delivery Network Design Beyond 5nm", 2019 IEEE International Electron Devices Meeting (IEDM), Dec. 7-11, 2019, pp. 19.1.1-19.1.4.

Ryckaert, J. et al, "Extending the roadmap beyond 3nm through system scaling boosters: a case study on Buried Power Rail and Backside Power Delivery", 2019 Electron Devices Technology and Manufacturing Conference (EDTM) (2019), pp. 50-52.

\* cited by examiner

ISOLATION OF SEMICONDUCTOR DEVICES BY BURIED SEPARATION RAILS

TECHNICAL FIELD

This disclosure relates generally to the field of semiconductor devices, and more specifically, to integrated circuit (IC) structures.

BACKGROUND

For the past several decades, the scaling of features in ICs has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. Buried power rails (BPRs) can be a key scaling booster for complementary metal-oxide-semiconductor (CMOS) extension, e.g., beyond the 5-nm node.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
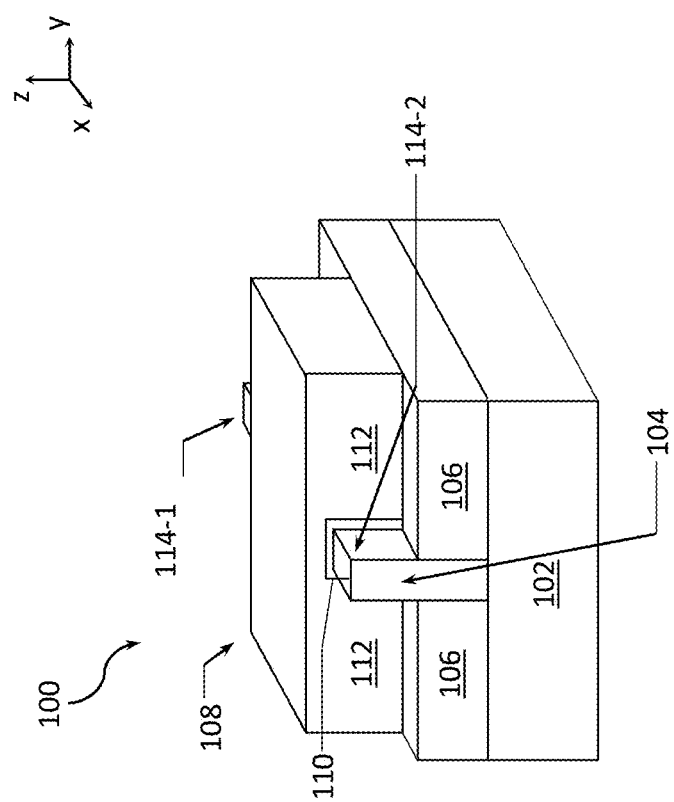
FIG. 1 is a perspective view of an example fin-based field-effect transistor (FET), or FinFET, according to some embodiments of the disclosure.

The systems, methods, and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC devices with semiconductor devices separated by BSRs, proposed herein, it might be useful to first understand phenomena that may come into play in such structures. The following foundational information may be viewed as a basis from which the present disclosure may be properly explained. Such information is offered for purposes of explanation only and, accordingly, should not be construed in any way to limit the broad scope of the present disclosure and its potential applications. While some of the following descriptions may be provided for the example of transistors being implemented as FinFETs, nanoribbon FETs, or nanowire FETs, embodiments of the present disclosure are equally applicable to IC devices employing transistors of other architectures such as to planar transistors.

Relentless scaling of transistors and wires in advanced semiconductor technologies has not only resulted in major process-related challenges but has also imposed severe design challenges in the sub-5 nm technology regime. Dimensional scaling of designs has been made possible by (i) Front-End-of-Line (FEOL) and Back-End-of-Line (BEOL) pitch scaling, which worsens short-channel effects in transistors and increases wire/contact resistances; and, (ii) fin depopulation in logic cells, which causes degradation of transistor drive. To enable further area scaling in sub-5 nm nodes, an approach of burying the power rails into the substrate has been proposed, which no longer requires reserving two routing tracks for power nets (e.g., VDD or VSS) in the logic cell area. Additionally, these BPRs can achieve a higher aspect ratio, thus, exhibiting lower resistance than local level BEOL power rails. BPRs can be a key scaling booster for complementary metal-oxide-semiconductor (CMOS) extension beyond the 5-nm node. Power lines which conventionally run outside substrates can be replaced with power lines "buried" within substrates, such as shallow trench isolation (STI) and Si substrate. Such power lines are called BPRs. A BPR is a power rail that is at least partially buried in a support structure, e.g., a substrate, die, etc. A BPR includes an electrically conductive material, such as metal. A rail can have an elongated structure having a longitudinal axis, which may be parallel to the frontside surface or the backside surface of the support structure. BPR frees up routing resources, which results in logic cell height reduction and overall area scaling.

With the increased integration of radio frequency (RF) functions into CMOS integrated circuits, as well as the continued scaling of semiconductor process technology, the distance between separate circuit blocks keeps decreasing. This raises the risk of unwanted signal coupling which might deteriorate the device performance or even lead to malfunctioning of the system. One example for such a sensitive circuit pair can be found in modern wireless transceivers, where an RF signal is up-converted by a voltage-controlled oscillator and subsequently transmitted by a power amplifier. It has been shown that coupling via the substrate is the main parasitic coupling mechanism. As the rf signal couples to the substrate via junction diodes, this substrate noise is expected to become even more severe in the future when operation frequencies for modern Wi-Fi, radio or radar applications move into the millimeter-wave regime covering bands in a range of 24-100 GHz. Therefore, it is indispensable that any future state-of-the-art process technology offers an effective way for substrate isolation to allow the development of high-performance and highly-integrated mixed-signal circuits.

In CMOS processes with triple-well option, isolation is typically achieved by enclosing the sensitive circuit blocks by a deep n-well and an n-well ring. Thereby, the reverse-biased PW/NW and p-well/deep n-well junction diodes are taken advantage of. A different option is to block the p-well implant in the vicinity of the sensitive circuit to create an enclosure with a locally increased well resistance. For silicon-on-insulator (SOI) processes, substrate wafers with high resistance are used to provide isolation.

However, isolation by p-well/deep n-well diode junctions suffers strongly when higher frequencies are at play, as the impedance decreases inversely with frequency. Additional complications arise for high power applications, as a high-voltage input swing might lead to a forward-biasing of the diode and, hence, increased signal loss into the substrate. Furthermore, a triple-well option might not always be available in a given process or come at the cost of an additional mask. While the p-well implant blockage is a feature that is generally available without additional cost, the substrate resistance for FinFET processes is not high enough to provide sufficient isolation. Changing the substrate to a high-ohmic option as done for SaI is, however, not feasible for FinFET and bulk CMOS technologies as this would lead to a reduced tolerance to latch-up events.

Embodiments of the present invention relate to IC devices where semiconductor devices are isolated by BSRs, i.e., separation rails buried in support structures (e.g., substrates). BSRs can also be used as BPRs for power delivery. An example IC device includes a support structure, a BSR in the support structure, and a first and a second semiconductor devices in the support structure. The first semiconductor device can be an aggressor and the semiconductor device can be a victim, meaning signals from the aggressor can be transformed to the victim through the support structure and impair performance or functionality of the victim. The BSR includes an electrical insulator, e.g., an oxide material. The BSR define boundaries of first and second sections in the support structure. The first semiconductor device is in the first section, the second semiconductor device is in the second section. The BSR isolates the first semiconductor device from the second semiconductor device and blocks signals from the first semiconductor device to be transmitted to the second semiconductor device through the support structure.

The BSR may have various shapes. In an example, the BSR has a ring shape and encloses one or both of the first and second sections. That way, the BSR can define the boundaries of the two sections in three-dimensions. In another embodiment, the BSR have a line shape and define the boundaries of the two sections in two-dimensions. In some embodiments, the BSR may be connected to a TSV, which also includes an electrical insulator. The BSR and TSV can form a full isolation of the two sections. For instance, the BSR is connected to the frontside surface of the support structure and the TSV is connected to the backside surface of the support structure. In other embodiments, the BSR is biased to provide the isolation.

The BSR may be formed by a process forming BPRs. For instance, the BSR can be formed by filling a trench in the support structure with the electrical insulator. In some embodiments, the BSR can be used as a BPR to deliver power to the semiconductor devices or other components of the IC device. The BSR include an electrical conductor in addition to the electrical insulator. The electrical conductor is at least partially enclosed by the electrical insulator, where the electrical insulator is an insulator barrier that insulates the electrical conductor from a semiconductor material in the support structure.

The present invention can be used for products with operation in the high speed analog, RF or millimeter-wave frequency domains, as capacitive coupling from the junction diodes into the substrate gets more pronounced with increased frequencies. Moreover, the use of the BSR for isolating circuit blocks eliminates p-well-deep n-well diode junctions for isolation. The coupling between BSR-separated wells depends on the electrical insulator in the BSR, which offers a bias independent capacitance. The capacitance can be tuned by properties of the electrical insulator, such as thickness and material choice, without interfering with any front-end process parameters. Also, in contrast to deep n-well enclosure, the substrate capacitance scales with the perimeter of the isolated region rather than with area. Furthermore, isolation by BSR can reduce cost of fabricating IC devices by omitting the deep n-well mask required to form deep n-well.

N-well and p-well are mentioned throughout the present description. As used herein, an n-well in a support structure refers to a region of a semiconductor material (which may include a plurality of different semiconductor materials) doped with n-type dopants in dopant concentrations that are higher than the dopant concentration in the support structure outside of the n-well. A p-well in a support structure refers to a region of a semiconductor material (which may include a plurality of different semiconductor materials) doped with p-type dopants in dopant concentrations that are higher than the dopant concentration in the support structure outside of the p-well. An n-doped region can be formed in a portion of the n-well. The dopant concentration of the n-doped region is higher than the dopant concentration of the n-well outside the n-doped region. A p-doped region can be formed in a portion of the p-well. The dopant concentration of the p-doped region is higher than the dopant concentration of the p-well outside the p-doped region. For example, a dopant concentration of the support structure outside of the n-well and the p-well may be lower than about $10^{16}$ dopants per cubic centimeter, e.g., lower than about $5 \times 10^{15}$ dopants per cubic centimeter, a dopant concentration of the n-doped region or of the p-doped region may be greater than about $10^{19}$ dopants per cubic centimeter, e.g., greater than about $5 \times 10^{19}$ dopants per cubic centimeter, and a dopant concentration of the n-well or the p-well may be greater than the dopant concentration of the support structure outside of the n-well and the p-well and lower than the dopant concentration of the n-doped region or of the p-doped region (e.g., between about $5 \times 10^{16}$ dopants per cubic centimeter and $5 \times 10^{18}$ dopants per cubic centimeter). In the following, reference to a "dopant concentration of a support structure" implies a dopant concentration in a portion of the support structure outside of the n-well and the p-well. As is known in the field of semiconductor devices, both n-type and p-type dopants may be present within a semiconductor material, but the term "n-well" refers to a doped well where the amount of n-type dopants is higher, typically significantly higher, than the amount of p-type dopants, while the term "p-well" refers to a doped well where the amount of p-type dopants is higher, typically significantly higher, than the amount of n-type dopants. Similarly, the term "n-doped region" refers to a doped region where the amount of n-type dopants is higher, typically significantly higher, than the amount of p-type dopants, while the term "p-doped region" refers to a doped region where the amount of p-type dopants is higher, typically significantly higher, than the amount of n-type dopants. Reference to a "dopant concentration" in these wells and regions implies dopant concentrations of the type of dopants with the greater amount. For example, a dopant concentration of an n-doped region being at a certain level refers to the dopant concentration of the n-type dopants, while a dopant concentration of ap-doped region being at a certain level refers to the dopant concentration of the p-type dopants.

Elongated structures are mentioned throughout the present description. As used herein, a structure is referred to as an elongated if a length of the structure (measured alone one axis of an example coordinate system) is greater than both a width of the structure (measured along another axis of the example coordinate system) and a height of the structure (measured along a third axis of the example coordinate system). For example, elongated semiconductor structures as described herein may be fins or nanoribbons, having a length measured along an x-axis of the coordinate system shown in the present drawings, a width measured along a y-axis of the coordinate system shown in the present drawings, and a height measured along a z-axis of the coordinate system shown in the present drawings. Because BPRs described herein, as well as openings above them, are substantially parallel to the semiconductor structures, their lengths, widths, and heights are also measured along, respectively, an x-axis, a y-axis, and a z-axis of the x-y-z coordinate system shown in the present drawings. On the other hand, when the metal gate lines are substantially perpendicular to the semiconductor structures, as shown in the embodiments of the present drawings, their lengths, widths, and heights are measured along, respectively, a y-axis, an x-axis, and a z-axis of the x-y-z coordinate system shown.

While some of the descriptions provided herein refer to FinFETs, these descriptions are equally applicable to embodiments any other non-planar FETs besides FinFETs, e.g., to nanoribbon transistors, nanowire transistors, or transistors such as nanoribbon/nanowire transistors but having transverse cross-sections of any geometry (e.g., oval, or a polygon with rounded corners).

IC devices as described herein, in particular IC devices with including a transmission line placed based on BPRs as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials, and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, such a collection may be referred to herein without the letters.

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number of semiconductor structures, a certain number of electrically conductive layers, a certain number of BPRs, a certain number of vias, a certain number of TSVs, a certain number of transmission lines, etc.), this is simply for ease of illustration, and more, or less, than that number may be included in an IC device with at least one BPR as described herein. Still further, various views shown in some of the drawings are intended to show relative arrangements of various elements therein. In other embodiments, various IC devices with BPRs as described herein, or portions thereof, may include other elements or components that are not illustrated (e.g., transistor portions, various components that may be in electrical contact with any of the transistors, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of IC devices with BPRs as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, some descriptions may refer to a particular source or drain region or contact being either a source region/contact or a drain region/contact. However, unless specified otherwise, which region/contact of a transistor is considered to be a source region/contact and which region/contact is considered to be a drain region/contact is not important because under certain operating conditions, designations of source and drain are often interchangeable. Therefore, descriptions provided herein may use the term of a "S/D" region/contact to indicate that the region/contact can be either a source region/contact, or a drain region/contact.

In another example, if used, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials.

In another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

In yet another example, a term "interconnect" may be used to describe any element formed of an electrically conductive material for providing electrical connectivity to one or more components associated with an IC or/and between various such components. In general, the "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of an IC chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC chip or a support structure over which an IC device is provided and may interconnect two conductive lines in adjacent levels or two conductive lines in not adjacent levels. A term "metallization stack" may be used to refer to a stack of one or more interconnects for providing connectivity to different circuit components of an IC chip.

Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Example FinFET

FIG. 1 is a perspective view of an example FinFET 100, according to some embodiments of the disclosure. The FinFET 100 illustrates one example of a transistor that can be coupled to BPRs. The FinFET 100 shown in FIG. 1 is intended to show relative arrangement(s) of some of the components therein. In various embodiments, the FinFET 100, or portions thereof, may include other components that are not illustrated (e.g., any further materials, such as spacer materials, surrounding the gate stack of the FinFET 100, electrical contacts to the S/D regions of the FinFET 100, etc.).

As shown in FIG. 1, the FinFET 100 may be provided over a support structure 102, where the support structure 102 may be any suitable support structure on which a transistor may be built, e.g., a substrate, a die, a wafer, or a chip. As also shown in FIG. 1, the FinFET 100 may include a fin 104, extending away from the support structure 102. A portion of the fin 104 that is closest to the support structure 102 may be enclosed by an insulator material 106, commonly referred to as an "STI material" or, simply, "STI." The portion of the fin 104 enclosed on its' sides by the STI 106 is typically referred to as a "subfin portion" or simply a "subfin." As further shown in FIG. 1, a gate stack 108 that includes at least a layer of a gate electrode material 112 and, optionally, a layer of a gate dielectric 110, may be provided over the top and sides of the remaining upper portion of the fin 104 (e.g., the portion above and not enclosed by the STI 106), thus wrapping around the upper-most portion of the fin 104. The portion of the fin 104 over which the gate stack 108 wraps around may be referred to as a "channel portion" of the fin 104 because this is where, during operation of the FinFET 100, a conductive channel may form. The channel portion of the fin 104 is a part of an active region of the fin 104. A first S/D region 114-1 and a second S/D region 114-2 (also commonly referred to as "diffusion regions") are provided on the opposite sides of the gate stack 108, forming source and drain terminals of the FinFET 100.

In general, implementations of the present disclosure may be formed or carried out on a support structure such as a semiconductor substrate, composed of semiconductor material systems including, for example, n-type or p-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In some embodiments, the substrate may be non-crystalline. In some embodiments, the support structure 102 may be a printed circuit board (PCB) substrate. Although a few examples of materials from which the substrate may be formed are described here, any material that may serve as a foundation upon which IC devices implementing isolation of semiconductor devices based on BSRs as described herein may be built falls within the spirit and scope of the present disclosure. In various embodiments, the support structure 102 may include any such substrate material that provides a suitable surface for forming the FinFET 100. The support structure 102 may, e.g., be the wafer 2000 of FIG. 11A, discussed below, and may be, or be included in, a die, e.g., the singulated die 2002 of FIG. 11B, discussed below.

As shown in FIG. 1, the fin 104 may extend away from the support structure 102 and may be substantially perpendicular to the support structure 102. The fin 104 may include one or more semiconductor materials, e.g., a stack of semiconductor materials, so that the upper-most portion of the fin (namely, the portion of the fin 104 enclosed by the gate stack 108) may serve as the channel region of the FinFET 100. Therefore, as used herein, the term "channel material" of a transistor may refer to such upper-most portion of the fin 104, or, more generally, to any portion of one or more semiconductor materials in which a conductive channel between source and drain regions may be formed during operation of a transistor.

As shown in FIG. 1, the STI material 106 may enclose the sides of the fin 104. A portion of the fin 104 enclosed by the STI 106 forms a subfin. In various embodiments, the STI material 106 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 106 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

Above the subfin portion of the fin 104, the gate stack 108 may wrap around the fin 104 as shown in FIG. 1. In particular, the gate dielectric 110 may wrap around the upper-most portion of the fin 104, and the gate electrode 112 may wrap around the gate dielectric 110. The interface between the channel portion of the fin 104 and the subfin portion of the fin 104 is located proximate to where the gate electrode 112 ends.

The gate electrode 112 may include one or more gate electrode materials, where the choice of the gate electrode materials may depend on whether the FinFET 100 is a p-type metal-oxide-semiconductor (PMOS) transistor or an n-type metal-oxide-semiconductor (NMOS) transistor. For a PMOS transistor, gate electrode materials that may be used in different portions of the gate electrode 112 may include, but are not limited to, ruthenium, palladium, platinum, cobalt, nickel, and conductive metal oxides (e.g., ruthenium oxide). For an NMOS transistor, gate electrode materials that may be used in different portions of the gate electrode 112 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 112 may include a stack of a plurality of gate electrode materials, where zero or more materials of the stack are workfunction (WF) materials and at least one material of the stack is a fill metal layer. Further materials/layers may be included next to the gate electrode 112 for other purposes, such as to act as a diffusion barrier layer or/and an adhesion layer.

If used, the gate dielectric 110 may include a stack of one or more gate dielectric materials. In some embodiments, the gate dielectric 110 may include one or more high-k dielectric materials. In various embodiments, the high-k dielectric materials of the gate dielectric 110 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 110 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 110 during manufacture of the FinFET 100 to improve the quality of the gate dielectric 110.

In some embodiments, the gate stack 108 may be surrounded by a dielectric spacer, not specifically shown in FIG. 1. The dielectric spacer may be configured to provide separation between the gate stacks 108 of different FinFETs 100 which may be provided along a single fin (e.g., different FinFETs provided along the fin 104, although FIG. 1 only illustrates one of such FinFETs), as well as between the gate stack 108 and the source/drain contacts disposed on each side of the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. When such a dielectric spacer is used, then the lower portions of the fin 104, e.g., the subfin portion of the fin 104, may be surrounded by the STI material 106 which may, e.g., include any of the high-k dielectric materials described herein.

In some embodiments, the fin 104 may be composed of semiconductor material systems including, for example, n-type or p-type materials systems. In some embodiments, the fin 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the fin 104 may include a combination of semiconductor materials where one semiconductor material is used for the channel portion and another material, sometimes referred to as a "blocking material," is used for at least a portion of the subfin portion of the fin 104. In some embodiments, the subfin and the channel portions of the fin 104 are each formed of monocrystalline semiconductors, such as silicon or germanium. In a first embodiment, the subfin and the channel portion of the fin 104 are each formed of compound semiconductors with a first sub-lattice of at least one element from group III of the periodic table (e.g., Al, Ga, In), and a second sub-lattice of at least one element of group V of the periodic table (e.g., P, As, Sb). The subfin may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

For some example n-type transistor embodiments (i.e., for the embodiments where the FinFET 100 is an NMOS), the channel portion of the fin 104 may advantageously include a III-V material having a high electron mobility, such as, but not limited to InGaAs, InP, InSb, and InAs. For some such embodiments, the channel portion of the fin 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion of the fin 104 may be an intrinsic III-V material, i.e., a III-V semiconductor material not intentionally doped with any electrically active impurity. In alternate embodiments, a nominal impurity dopant level may be present within the channel portion of the fin 104, for example to further fine-tune a threshold voltage Vt, or to provide HALO pocket implants, etc. Even for impurity-doped embodiments however, impurity dopant level within the channel portion of the fin 104 may be relatively low, for example below $10^{15}$ dopant atoms per cubic centimeter ($cm^{-3}$), and advantageously below $10^{13}$ $cm^{-3}$. The subfin portion of the fin 104 may be a III-V material having a band offset (e.g., conduction band offset for n-type devices) from the channel portion. Example materials include, but are not limited to, GaAs, GaSb, GaAsSb, GaP, InAlAs, GaAsSb, AlAs, AlP, AlSb, and AlGaAs. In some n-type transistor embodiments of the FinFET 100 where the channel portion of the fin 104 is InGaAs, the subfin may be GaAs, and at least a portion of the subfin may also be doped with impurities (e.g., p-type) to a greater impurity level than the channel portion. In an alternate heterojunction embodiment, the subfin and the channel portion of the fin 104 are each, or include, group IV semiconductors (e.g., Si, Ge, SiGe). The subfin of the fin 104 may be a first elemental semiconductor (e.g., Si or Ge) or a first SiGe alloy (e.g., having a wide bandgap).

For some example p-type transistor embodiments (i.e., for the embodiments where the FinFET 100 is a PMOS), the channel portion of the fin 104 may advantageously be a group IV material having a high hole mobility, such as, but not limited to Ge or a Ge-rich SiGe alloy. For some example embodiments, the channel portion of the fin 104 may have a Ge content between 0.6 and 0.9, and advantageously may be at least 0.7. In some embodiments with highest mobility, the channel portion may be intrinsic III-V (or IV for p-type devices) material and not intentionally doped with any electrically active impurity. In alternate embodiments, one or more a nominal impurity dopant level may be present within the channel portion of the fin 104, for example to further set a threshold voltage Vt, or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$. The subfin of the fin 104 may be a group IV material having a band offset (e.g., valance band offset for p-type devices) from the channel portion. Example materials include, but are not limited to, Si or Si-rich SiGe. In some p-type transistor embodiments, the subfin of the fin 104 is Si and at least a portion of the subfin may also be doped with impurities (e.g., n-type) to a higher impurity level than the channel portion.

Turning to the first S/D region 114-1 and the second S/D region 114-2 on respective different sides of the gate stack 108, in some embodiments, the first S/D region 114-1 may be a source region and the second S/D region 114-2 may be a drain region. In other embodiments this designation of source and drain may be interchanged, i.e., the first S/D region 114-1 may be a drain region and the second S/D region 114-2 may be a source region. Although not specifically shown in FIG. 1, the FinFET 100 may further include S/D electrodes (also commonly referred to as "S/D contacts"), formed of one or more electrically conductive materials, for providing electrical connectivity to the S/D regions 114, respectively. In some embodiments, the S/D regions 114 of the FinFET 100 may be regions of doped semiconductors, e.g., regions of doped channel material of the fin 104, so as to supply charge carriers for the transistor channel. In some embodiments, the S/D regions 114 may be highly doped, e.g., with dopant concentrations of about $1.10^{21}$ $cm^{-3}$, in order to advantageously form Ohmic contacts with the respective S/D electrodes, although these regions may also have lower dopant concentrations and may form Schottky contacts in some implementations. Irrespective of the exact doping levels, the S/D regions 114 of the FinFET 100 are the regions having dopant concentration higher than in other regions, e.g., higher than a dopant concentration in a region of the semiconductor channel material between the first S/D region 114-1 and the second S/D region 114-2, and, therefore, may be referred to as "highly doped" (HD) regions.

In some embodiments, the S/D regions 114 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the fin 104 to form the S/D regions 114. An annealing process that activates the dopants and causes them to diffuse further into the fin 104 may follow the ion implantation process. In the latter process, the one or more semiconductor materials of the fin 104 may first be etched to form recesses at the locations for the future source and drain regions. An epitaxial deposition process may then be carried out to fill the recesses with material (which may include a combination of different materials) that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. Although not specifically shown in the perspective illustration of FIG. 1, in further embodiments, one or more layers of metal and/or metal alloys may be used to form the source and drain contacts (i.e., electrical contacts to each of the S/D regions 114).

The FinFET 100 may have a gate length, GL, (i.e., a distance between the first S/D region 114-1 and the second S/D region 114-2), a dimension measured along the longitudinal axis of the fin 104, which extends in the direction of the x-axis of the example reference coordinate system x-y-z shown in the present drawings, where the gate length may, in some embodiments, be between about 5 and 40 nanometers, including all values and ranges therein (e.g. between about 22 and 35 nanometers, or between about 15 and 25 nanometers). The fin 104 may have a thickness, a dimension measured in the direction of the y-axis of the reference coordinate system x-y-z shown in FIG. 1, that may, in some embodiments, be between about 4 and 15 nanometers, including all values and ranges therein (e.g., between about 5 and 10 nanometers, or between about 7 and 12 nanometers). The fin 104 may have a height, a dimension measured in the direction of the z-axis of the reference coordinate system x-y-z shown in FIG. 1, which may, in some embodiments, be between about 30 and 350 nanometers, including all values and ranges therein (e.g., between about 30 and 200 nanometers, between about 75 and 250 nanometers, or between about 150 and 300 nanometers).

Although the fin 104 is illustrated in FIG. 1 as having a rectangular cross-section in a z-y plane of the reference coordinate system shown in FIG. 1, the fin 104 may instead have a cross-section that is rounded or sloped at the "top" of the fin 104, and the gate stack 108 (including the different portions of the gate dielectric 110) may conform to this rounded or sloped fin 104. In use, the FinFET 100 may form conducting channels on three "sides" of the channel portion of the fin 104, potentially improving performance relative to single-gate transistors (which may form conducting channels on one "side" of a channel material or substrate) and double-gate transistors (which may form conducting channels on two "sides" of a channel material or substrate). While FIG. 1 illustrates a single FinFET 100, in some embodiments, a plurality of FinFETs may be arranged next to one another (with some spacing in between) along the fin 104.

Other types of semiconductor structures can be used in a FET. For example, nanoribbon-based FETs include elongated semiconductor structures called nanoribbons as semiconductor structures. As another example, nanowire-based FETs include nanowires as semiconductor structures. As used herein, the term "nanoribbon" refers to an elongated semiconductor structure having a longitudinal axis parallel to the support structure over which a memory device is provided. Typically, a length of a such a structure (i.e., a dimension measured along the longitudinal axis, shown in the present drawings to be along the y-axis of an example x-y-z coordinate system) is greater than each of a width (i.e., a dimension measured along the x-axis of the example coordinate system shown in the present drawings) and a thickness/height (i.e., a dimension measured along the z-axis of the example coordinate system shown in the present drawings). In some settings, the terms "nanoribbon" or "nanosheet" have been used to describe elongated semiconductor structures that have a rectangular transverse cross-section (i.e., a cross-section in a plane perpendicular to the longitudinal axis of the structure), while the term "nanowire" has been used to describe similar elongated structures but with circular transverse cross-sections.

Figure 2:
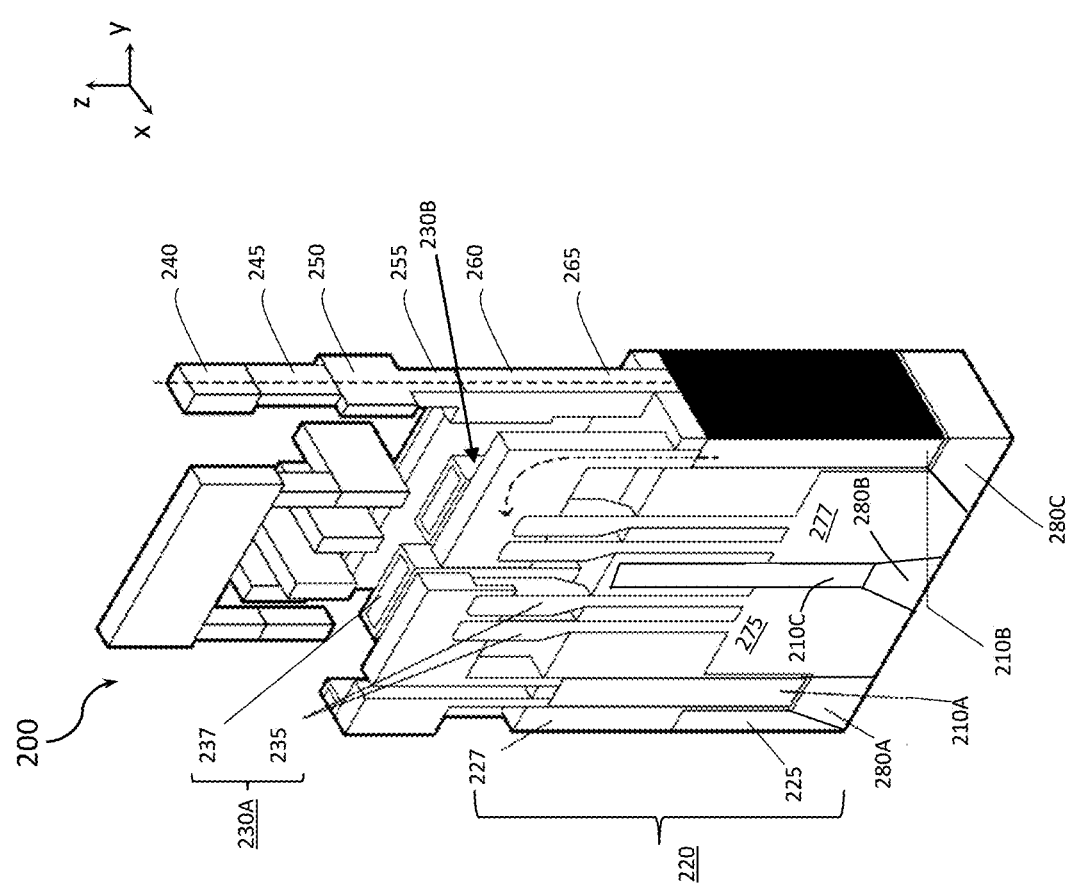
FIG. 2 is a perspective view of an example IC device including transistors isolated by buried power rails (BPRs), according to some embodiments of the disclosure.

FIG. 2 is a perspective view of an example IC device 200 including transistors 230A-B isolated by BSRs 210A-C, according to some embodiments of the disclosure. The IC device 200 includes a support structure 220 where the BSRs 210A-C (collectively referred to as "BSRs 210" or "BSR 210") are buried, electrically conductive layers 240, 250, and 260, vias 245, 255, and 265, and TSVs 280A-C (collectively referred to as "TSVs 280" or "TSV 280"). In other embodiments, the IC device 200 may include more, fewer, or different components. In some embodiments, the components of the IC device 200 may be arranged differently. For instance, the electrically conductive layer 240 may be arranged below the support structure 220 for backside power delivery.

The transistors 230A-B (collectively referred to as "transistors 230" or "transistor 230") each include semiconductor structures 235 (individually referred to as "semiconductor structure 235") and a gate 237. A semiconductor structure 235 may be a fin, nanoribbon, or nanowire of a semiconductor material. In some embodiments, at least a portion of a semiconductor structure 235 are formed in the support structure 220. The gate 237 has a first portion at least partially wrapping around a portion of a semiconductor structure 235 on a source region of the transistor 230. The gate 237 also has a second portion at least partially wrapping around a portion of another semiconductor structure 235 on a drain region of the transistor 230. An embodiment of the gate 237 is the gate stack 108 in FIGS. 1-3. A transistor 230 may be a NMOS or PMOS transistor. In some embodiments, a transistor 230 is a part of an electronic device.

The transistors 230 may include an aggressor and a victim. For example, the transistor 230A is the aggressor and the transistor 230B is the victim. Signals from the transistor 230A (or the electronic device including the transistor 230A) can be transmitted to the transistor 230B through the support structure 220. Such signals are referred to as substrate noises and can interfere with operations of the transistor 230B (or the electronic device including the transistor 230B). Thus, the transistor 230B needs to be isolated from the transistor 230A. In the embodiment of FIG. 2, the transistor 230B needs to be isolated from the transistor 230A by the BSRs 210. The BSRs 210 defines boundaries of two sections 275 and 277 in the support substrate 220. The section 275 is between the BSRs 210A and 210C, the section 277 is between the BSRs 210B and 210C. The semiconductor structures 235 of the transistor 230A is in the section 275, versus the semiconductor structures 235 of the transistor 230B is in the section 277. The BIPs 210 couples with p-wells in the support structure 220, which results in serial capacitance. The support structure 220 may be a p-type substrate and includes a p-type semiconductor material. The serial capacitance provides isolation of the transistor 230A from the transistor 230B In some embodiments, the serial capacitance is defined by electrical insulators in the BSRs 210. For instance, a BSR 210 includes a conducting core and a barrier enclosing at least part of the conducting core. The conducting core comprises an electrical conductor, such as metal. The barrier includes a dielectric material/electrical insulator that insulates the conducting core from the semiconductor material in the support structure 220. An example of the electrical insulator is an oxide material, such as silicon oxide. The BSRs 210 are connected to the TSVs 280. A TSV 280 may also include a conducting core and a dielectric barrier. The TSVs may be micro-TSVs or nano-TSVs. A nano-TSV has a diameter, e.g., in the x-y plane, of less than one micrometer. A micro-TSV has a diameter of one micrometer or larger. The BSRs 210 and TSVs 280 can provide a full isolation along the length of the support structure 220 along the z-axis. The BSRs 210 can be used as BPRs. In the embodiment of FIG. 2, the BSRs 210A-B are used as BPRs for frontside power delivery. More details about the frontside power delivery are described below.

The support structure 220 includes a semiconductor layer 225 and an insulator layer 227. A portion of each BSR 210 is buried in the semiconductor layer 225, and the remaining portion of the BSR 210 is buried in the insulator layer 227. The semiconductor layer 225 includes a semiconductor material. Examples of the semiconductor material include, for example, single crystal silicon, polycrystalline silicon, SaI, other suitable semiconductor material, or some combination thereof. The semiconductor layer 225 may also include other materials, such as metal, dielectric, dopant, and so on. In FIG. 2, the semiconductor layer 225 has a top surface and a bottom surface. The top surface of the semiconductor layer 225 contacts with the bottom surface of the insulator layer 227. The bottom surface of the semiconductor layer 225 is the bottom surface of the IC device 200 and can be referred to as the backside of the IC device 200. In some embodiments, the semiconductor layer 225, or a portion of it, is dopped to generate a p-type support structure or n-type support structure.

The insulator layer 227 functions as an electrical insulator that isolates conducting and semiconducting materials from each other. In some embodiments, the insulator layer 227 is an oxide layer. An example oxide layer is a layer of silicon oxide, $SiO_x$, where x is an integer number, such as 2, 2, etc. The insulator layer 227 adjoins the semiconductor layer 225. As shown in FIG. 2, the insulator layer 227 is above the semiconductor layer 225. In some embodiments, the insulator layer 427 is not a continuous insulator layer. Rather, the insulator layer 227 includes discrete insulator sections arranged in the semiconductor material of the semiconductor layer 225. The discrete insulator sections can insulate BPRs from the semiconductor material. The discrete insulator sections can also insulate semiconductor structures, which are formed in the semiconductor layer 225, of transistors from each other. The discrete insulator sections may include an oxide of the semiconductor material and can be formed from portions of the semiconductor layer 225.

In some embodiments, the insulator layer 227 may be formed by transforming a portion of a silicon support structure into silicon oxide. Silicon exposed to ambient conditions has a native oxide on its surface. The native oxide is approximately 3 nm thick at room temperature. However, 3 nm may be too thin for most applications and a thicker insulator layer needs to be grown. This is done by consuming the underlying Si to form SiOx. This is a grown layer. It is also possible to grow SiOx by a chemical vapor deposition process using Si and O precursor molecules. In this embodiment, the underlying Si in the wafer is not consumed. This is called a deposited layer. In some embodiments, the insulator layer 227 helps in protecting the components in the support structure 220 from contamination, both physical and chemical. Thus, it acts as a passivating layer. The insulator layer 227 can protect the components in the support structure 220 from scratches and it also prevents dust from interacting with the components in the support structure 220, and thus minimizes contamination. The insulator layer 227 also protects the components in the support structure 220 from chemical impurities, mainly electrically active contaminants. SiOx acts as a hard mask for doping and as an etch stop during patterning.

The BSRs 210A-B are electrically conductive. The BSRs 210A-B are coupled to one or more power sources and to semiconductor devices in the IC device 200 (such as the transistors 230) to provide power to the semiconductor devices. In FIG. 2, the two BSRs 210A-B are buried in the support structure 220. A portion of each BSR 210 is buried in the insulator layer 227. The remaining portion of each BSR 210 is buried in the semiconductor layer 225. The BSRs 210A-B may be made of a metal, such as tungsten (W), ruthenium (Ru), cobalt (Co), other metals, or some combination thereof. Each BSR 210 may include a dielectric barrier on its surface that touches the semiconductor layer 225. The dielectric barrier can insulate the metal in the BSR 210 from the semiconductor material of the semiconductor layer 225. The dielectric barrier may be an oxide barrier made from an oxide material.

The electrically conductive layers 240, 250, and 260 are built in the IC device 200 to provide power and signal to the semiconductor devices in the IC device 200. An electrically conductive layer is a layer comprising an electrically conductive material, e.g., metal. In an embodiment, the electrically conductive layers 240 and 260 are used for power delivery but the electrically conductive layer 250 is used for signal delivery. In some embodiments, the electrically conductive layer 260 is referred to as "MO," the electrically conductive layer 250 is referred to as "Mint," and the electrically conductive layer 260 is referred to as "Ml," given the sequence of producing the electrically conductive layers 240, 250, and 260 in the process of fabricating the IC device 200. The electrically conductive layers 240, 250, and 260 can be made of copper or other types of metals. Each electrically conductive layer 240, 250, or 260 includes multiple sections that can be separated and insulated from each other.

The BSR 210A-B, electrically conductive layers 240, 250, and 260, and vias 245, 255, and 265 constitute a conducting path for power delivery network, as indicated by the dotted line in FIG. 2. The vias 245, 255, and 265 are conducting. In one embodiment, some or all of the vias 245, 255, and 265 are made of copper or other types of metal. The vias 245 are between the electrically conductive layers 240 and 250 to couple the two electrically conductive layers 240 and 250 to each other. As shown in FIG. 2, there are three vias 245 between the electrically conductive layers 240 and 250. Each via 245 is for coupling a section of the electrically conductive layer 240 to a corresponding section of the electrically conductive layer 250. In other embodiments, there can be fewer or more vias 245 to couple the electrically conductive layers 240 and 250. Similarly, the via 255 is between the electrically conductive layers 250 and 260. The vias 265 couple the BSR 210A-B to the electrically conductive layer 260. In FIG. 2, there are two vias 265 connecting the BSR 210A to the electrically conductive layer 260 and two vias 265 connecting the BSR 210B to the electrically conductive layer 260. The electrically conductive layer 260 is coupled to the transistors 230, particularly to semiconductor structures 235 of the transistors 230.

In an example, the electrically conductive layer 240 functions as the power plane of the IC device 200. A positive or negative voltage, for example, can be provided to the electrically conductive layer 240 so that the BSR 210A is electrically biased. The BSR 210B is grounded so that there is an electric potential difference between the BSR 210A-B, which transfers to the electric potential difference between the transistors 230. As the electrically conductive layer 240 is on top of the transistors 230, the power delivery network is called "frontside power delivery network." In other embodiments, the IC device 200 may include an electrically conductive layer below the transistors 230, e.g., at the backside of the IC device 200. The electrically conductive layer may function as the power plane, ground plane, or both to form "backside power delivery network". The BSR 210A-B can be coupled to the electrically conductive layer by TSVs (e.g., TSVs 280A-B). The TSVs are below the BSR 210A-B and buried in the semiconductor layer 225 of the support structure 220. The power delivery network of the IC device 200 can be a network of interconnect that is separate from the signal network. For instance, portions of the electrically conductive layer 250 that are not in the power delivery network can be used to deliver signals.

In some embodiments, the IC device 200 is fabricated through a sequence of processes. Well formation is done as the first step. The first step comprises, for example, ion implantation and dopant activation anneal. Alternatively, well formation can be done after the fin reveal step. Subsequently, fin patterning and insulator layer formation are carried out. The insulator layer formation step may include silicon oxide deposition, silicon oxide anneal, and chemical mechanical polishing (CMP). The BSRs 210 are formed in the next step, which includes patterning BPR trench into the support structure 220. Subsequently, a dielectric barrier may be deposited onto the outer surfaces of the BSRs 210 (i.e., the surfaces touching the support structure 220) to electrically isolate the BSRs 210 from the support structure 220. In some embodiments, the step of forming the BSRs 210 may further include metal CMP and silicon oxide anneal. Next, fin reveal is carried out, e.g., by etching, to reveal the fins. After that, the electrically conductive layers 240, 250, and 260 and vias 245, 255, and 265 are integrated into the IC device 200.

Figure 3:
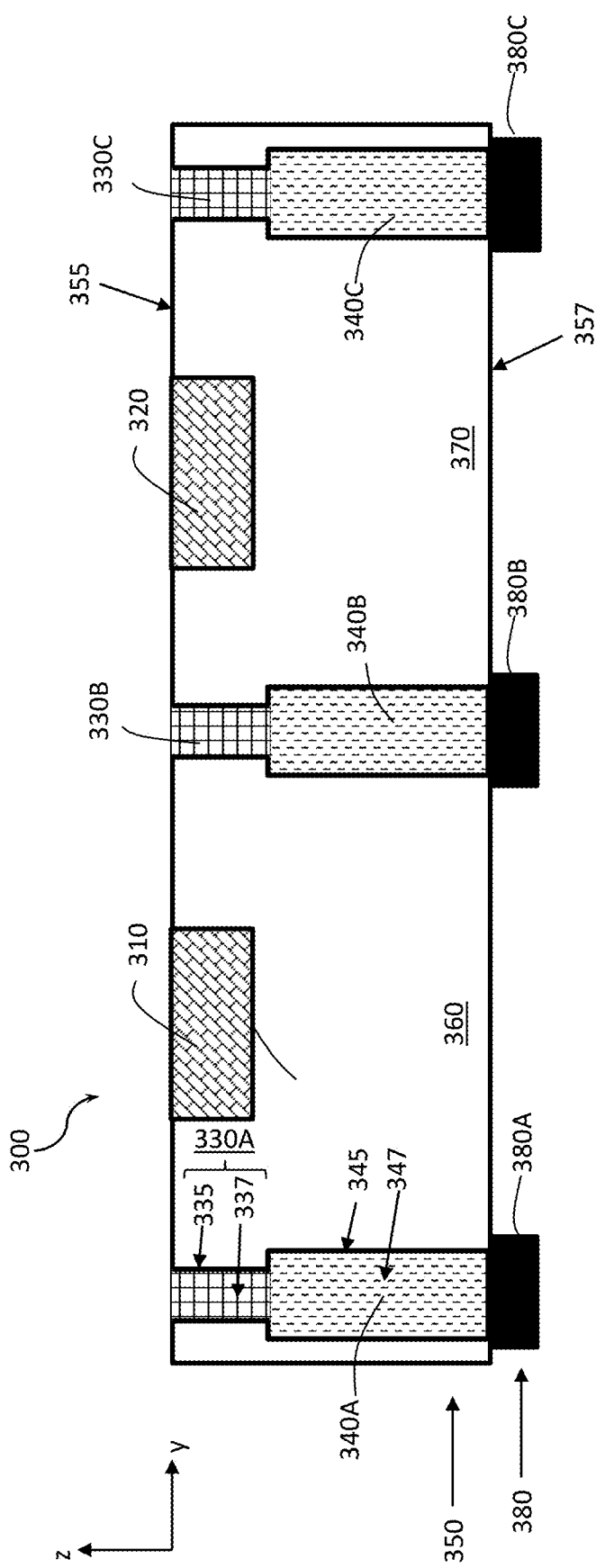
FIG. 3 is a cross-sectional of an example IC device including semiconductor devices isolated by BSRs and through-substrate vias (TSVs), according to some embodiments of the disclosure.

FIG. 3 is a cross-sectional view of an example IC device 300 including semiconductor devices 310 and 320 isolated by BSRs 330A-C and TSVs 340A-C, according to some embodiments of the disclosure. The IC device also includes a support structure 350 and an electrically conductive layer 380. In other embodiments, the IC device 300 may include fewer, more, or different components. For instance, the IC device 300 may include BPRs, or one or more electrically conductive layers coupled to the semiconductor devices 310 and 320.

The semiconductor devices 310 and 320 are electronic devices including one or more semiconductor materials. A semiconductor device relies on the electrical properties of its semiconductor material for its function. Example semiconductor devices include NMOS transistor, PMOS transistor, or other types of semiconductor devices. A semiconductor device includes one or more circuits and may be a circuit block of the IC device 300. In some embodiments, the semiconductor device 310 includes an analog circuit, and the semiconductor device 320 includes an different analog circuit. An analog circuit is a circuit that processes analog signals. An analog circuit includes one or more analog electronic components, such as resistors, capacitor, inductors, transistors, diode, amplifier, and so on. Example analog-digital circuits include power amplifier, voltage-controlled oscillator, stacked switch transistor, and so on. The semiconductor device 310 or 320 may include a digital circuit. A digital circuit is a circuit that processes digital signals. A digital circuit includes one or more digital electronic components, such as logical gates, transistors, processors, and so on. In some embodiments, the semiconductor devices 310 and 320 may include the same semiconductor material. The semiconductor devices 310 and 320 are adjacently located in the support structure 350. In some embodiments, the semiconductor devices 310 and 320 are associated. For instance, semiconductor devices 310 and 320 are components of a same device (e.g., a RF transmitter) in the IC device 300.

Substrate coupling between the adjacent semiconductor devices 310 and 320 can lead to significant performance deterioration. For instance, signals from the semiconductor device 310 can be transmitted to the semiconductor device 320 through the support structure 350. The signals can harm performance or functionality of the semiconductor device 320. In this example, the semiconductor device 310 is the aggressor and the semiconductor device 320 is the victim. A device can be both an aggressor and a victim. For instance, the semiconductor device 310 can be interfered by signals from the semiconductor device 320 that are transmitted to the semiconductor device 310 through the support structure 350. In order to protect the semiconductor device 320 from such substrate noises, the semiconductor devices 310 and 320 need to be isolated from each other.

The BSRs 330A-C (collectively referred to as "BSRs 330" or "BSR 330") and TSVs 340A-C (collectively referred to as "TSVs 340" or "TSV 340") are buried in the support structure 350 and isolate the semiconductor devices 310 and 320 from each other. Each BSR 330 is connected to a TSV 340. The BSRs 330 are separated from each other. The TSVs 340 are separated from each other. A TSV 340 may be a micro-TSV, which has a diameter no less than one micrometer, or nano-TSV, which has a diameter less than one micrometer. In some embodiments, the BSRs 330 may be integrated as one piece. Similarly, the TSVs 340 may be integrated as one piece. As shown in FIG. 3, the BSRs 330 and TSVs 340 defines two sections 360 and 370 in the support structure 350. The semiconductor device 310 is in the section 360 and the semiconductor device 320 is in the section 370. The coupling between the BSRs 330-TSVs 340 pairs and the p-type semiconductor material in the support structure 350 forms serial capacitance that isolates the semiconductor devices 310 and 320. Signals from the semiconductor device 310 will not be transmitted outside the section 360 and signals from the semiconductor device 320 will not be transmitted outside the section 370. Accordingly, semiconductor devices 310 and 320 will not be interfered by substrate noises.

The support structure 350 includes a semiconductor material, such as silicon. The support structure 350 may be a layer of the semiconductor material. The support structure 350 facilitates formation of semiconductor devices 310 and 320. In some embodiments, a semiconductor device 310 or 320 includes one or more semiconductor structures. A semiconductor structure 543 may be a fin, nanoribbon, nanowire, or a planar structure of a semiconductor material. A semiconductor structure may be a NMOS or PMOS. In some embodiments, a semiconductor structure is formed by doping a section of the support structure 350.

The support structure 350 includes two surfaces 355 and 357. The surface 357 opposes the surface 355. The semiconductor devices 310 and 320 are at the surface 355. The side of the support structure 350 from the surface 355 upwards is referred to as the frontside, and side of the support structure 350 from the surface 357 downwards is referred to as the backside of the support structure 350. In FIG. 3, the BSRs 330 are connected to the surface 355 of the support structure 350 and the TSVs 340 are connected to the surface 357 of the support structure 350. A TSV can be a continuous TSV. Accordingly, the BSRs 330 and TSVs 340 provide a full isolation of the two sections 360 and 370 of the support structure 350. In other embodiments, there may be a gap between a BSR 330 and the surface 355 or between a TSV 340 and the surface 357.

Electrically conductive layers may be arranged in the frontside and backside of the support structure 350. In the embodiment of FIG. 3, the electrically conductive layer 380 is at the backside of the support structure 350 and therefore, constitutes a backside electrically conductive layer. The electrically conductive layer 380 adjoins the surface 357 of the support structure 350. In other embodiments, the electrically conductive layer 380 may be separated from the support structure 350, e.g., by an insulator layer. The IC device 500 may include other electrically conductive layers, e.g., electrically conductive layers arranged in parallel to the electrically conductive layer 380.

The electrically conductive layer 380 is a layer comprising an electrically conductive material, e.g., metal. The electrically conductive layer 380 include sections 385A-C (collectively referred to as "sections 385" or "section 385"). The sections 385 are insulated from each other. For instance, the electrically conductive layer 380 is enclosed in an insulator layer (not shown in FIG. 3), which is a layer comprising an electrically insulating material, such as an oxide material. The electrically insulation material separates and insulates the sections 385 from each other. Each section 385 is connected to a TSV 340. Accordingly, the BSRs 330 are coupled to the electrically conductive layer 380 by the TSVs 340. The electrically conductive layer 380 may be used to deliver power to the semiconductor devices 310 and 320 or other semiconductor devices. For instance, the BSRs 330 are coupled to one or more semiconductor devices. The electrically conductive layer 380 is, or is coupled to, a power or ground plane of the IC device 300. The BSRs 330, TSVs 340, and electrically conductive layer 380 forms a conducting path for backside delivery. The BSRs 330 function as BPRs.

In the embodiment of FIG. 3, a BSR 330 includes an electrical insulator 335 and an electrical conductor 337. The electrical insulator 335 includes an electrically insulating material, such as an oxide material. An example oxide material is silicon oxide. The electrical conductor 337 includes an electrically conductive material, such as low resistance metal. The electrical conductor 337 is a conducting core of the BSR 330. The electrical insulator 335 is a dielectric barrier that separates and insulates the conducting core from the semiconductor material of the support structure 350.

A TSV 340 includes an electrical insulator 345 and an electrical conductor 347. The electrical insulator 345 includes an electrically insulating material, which may be the same material as the electrical insulator 335 of the BSRs 330. The electrical conductor 347 includes an electrically conductive material, such as low resistance metal. The electrical conductor 347 is a conducting core of the TSV 340. The electrical insulator 345 is a dielectric barrier that separates and insulates the conducting core from the semiconductor material of the support structure 350. The electrical conductor 347 of the TSV 340 is connected to the electrical conductor 337 of the corresponding BSR 330, which forms a conductive path. The TSVs 340 are connected to the electrically conductive layer 380.

As the BSRs 330 and TSVs 340 include electrical conductors that are separated from the support structure 350 by dielectric barriers, the coupling between adjacent p-wells is governed by serial capacitance. The serial capacitance is defined by the dielectric barriers around the BSRs 330 and TSVs 340. In contrast to junction diodes, the serial capacitance is not bias dependent and therefore, can provide a more robust isolation under high power operation. Furthermore, the serial capacitance can be tuned by appropriately modifying properties of the dielectric barriers (such as thickness, dielectric constant, etc.). The BSRs 330 and TSVs 340 can be optimized independently.

In other embodiments, the BSR 330 does not include the conductive core and is not used to deliver power. Rather, the whole BSR 330 is the electrical insulator 335. Similarly, the TSV 340 does not include the conductive core. Rather, the whole TSV 340 is the electrical insulator 345. In these embodiments, the IC device 300 may include BPRs that are separate from the BSRs 330 for power delivery.

Figure 4:
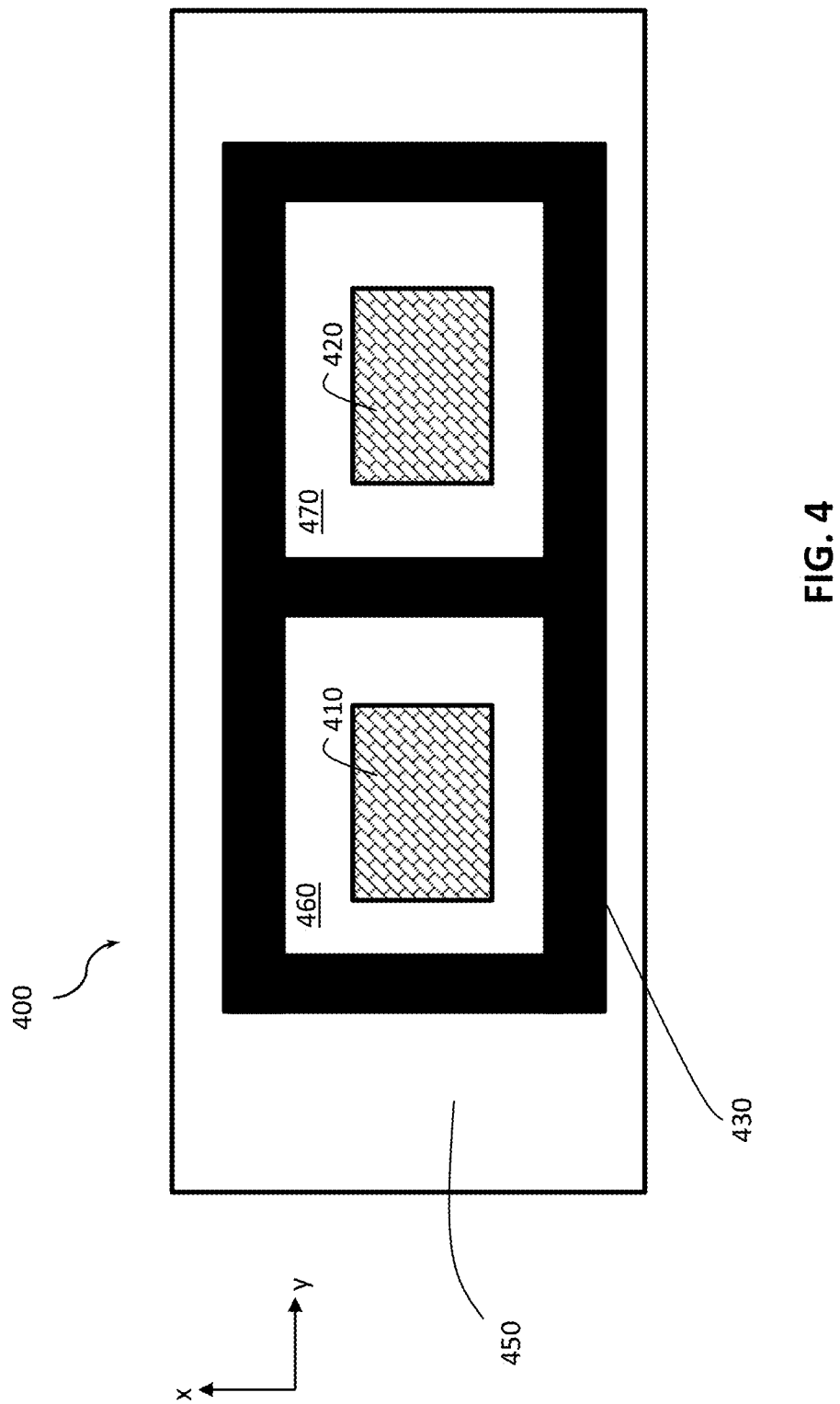
FIG. 4 is a top view of an example IC device including semiconductor devices isolated by a BSR, according to some embodiments of the disclosure.

FIG. 4 is a top view of an example IC device 400 including semiconductor devices 410 and 420 isolated by a BSR 430, according to some embodiments of the disclosure. The IC device 400 may be an embodiment of the IC device 300 in FIG. 3. The semiconductor devices 410 and 420 may be the same as or similar to the semiconductor devices 310 and 320 in FIG. 3. The IC device 400 also includes a support structure 450, in which the semiconductor devices 410 and 420 and BSR 430 are located. The support structure 450 may be the same as or similar to the support structure 350 in FIG. 3. The IC device 400 may include other components.

In the embodiment of FIG. 4, the BSR 430 is one piece and defines two sections 460 and 470 in the support structure 450. The sections 460 and 470 are enclosed by the BSR 430. Each section has a rectangular cross-section in the x-y plane. In other embodiments, the sections 460 and 470 can have different shapes. The semiconductor device 410 is in the section 460 and the semiconductor device 420 is in the section 470. The semiconductor devices 410 and 420 are enclosed by the BSR 430. With such as configuration, the semiconductor device 410 is isolated from the semiconductor device 420 by the BSR 430. The BSR 430 includes an electrical insulator. In some embodiments, the BSR 430 may also include an electrical conductor. At least part of the electrical conductor is enclosed by the electrical insulator. The electrical insulator can insulate the electrical conductor from the semiconductor material in the support structure 450. In some embodiments, the BSR 430 is connected to a TSV (not shown in FIG. 4). A cross-section of the TSV in the x-y plane can have the same or similar shape as the cross-section of the BSR 430 in the x-y plane.

Figure 5:
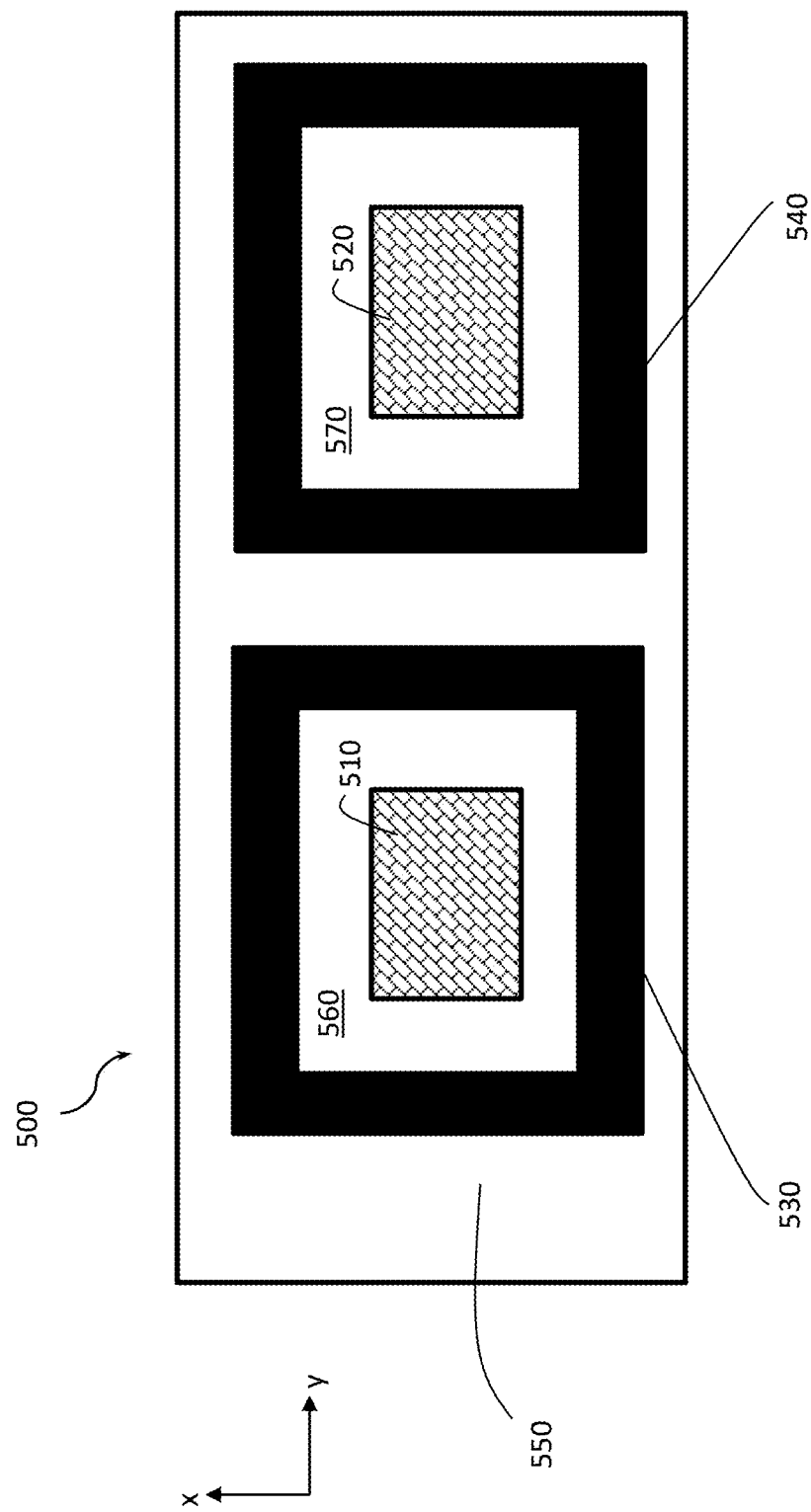
FIG. 5 is a top view of another example IC device including semiconductor devices isolated by BSRs, according to some embodiments of the disclosure.

FIG. 5 is a top view of another example IC device 500 including semiconductor devices 510 and 520 isolated by BSRs 530 and 540, according to some embodiments of the disclosure. The semiconductor devices 510 and 520 may be the same as or similar to the semiconductor devices 310 and 320 in FIG. 3. The IC device 500 also includes a support structure 550, in which the semiconductor devices 510 and 520 and BSRs 530 and 540 are located. The support structure 550 may be the same as or similar to the support structure 350 in FIG. 3. The IC device 500 may include other components.

In the embodiment of FIG. 5, the BSRs 530 and 540 defines two sections 560 and 570, respectively, in the support structure 550. The section 560 is enclosed by the BSR 530, and the section 570 is enclosed by the BSR 540. The cross-section of each BSR in the x-y plane has a shape of a rectangular ring. In other embodiments, the BSRs 530 and 540 may have cross-sections in other shapes, e.g., circular rings, etc. As the semiconductor device 510 is in the section 560 and the semiconductor device 520 is in the section 570, the semiconductor devices 510 and 520 are enclosed by the BSRs 530 and 540, respectively. With such as configuration, the semiconductor device 510 is isolated from the semiconductor device 520 by the BSRs 530 and 540. Each BSR includes an electrical insulator. In some embodiments, the BSR may also include an electrical conductor. At least part of the electrical conductor is enclosed by the electrical insulator. The electrical insulator can insulate the electrical conductor from the semiconductor material in the support structure 550. In some embodiments, each BSR is connected to a TSV (not shown in FIG. 5). A cross-section of the TSV in the x-y plane can have the same or similar shape as the cross-section of the BSR in the x-y plane.

Figure 6:
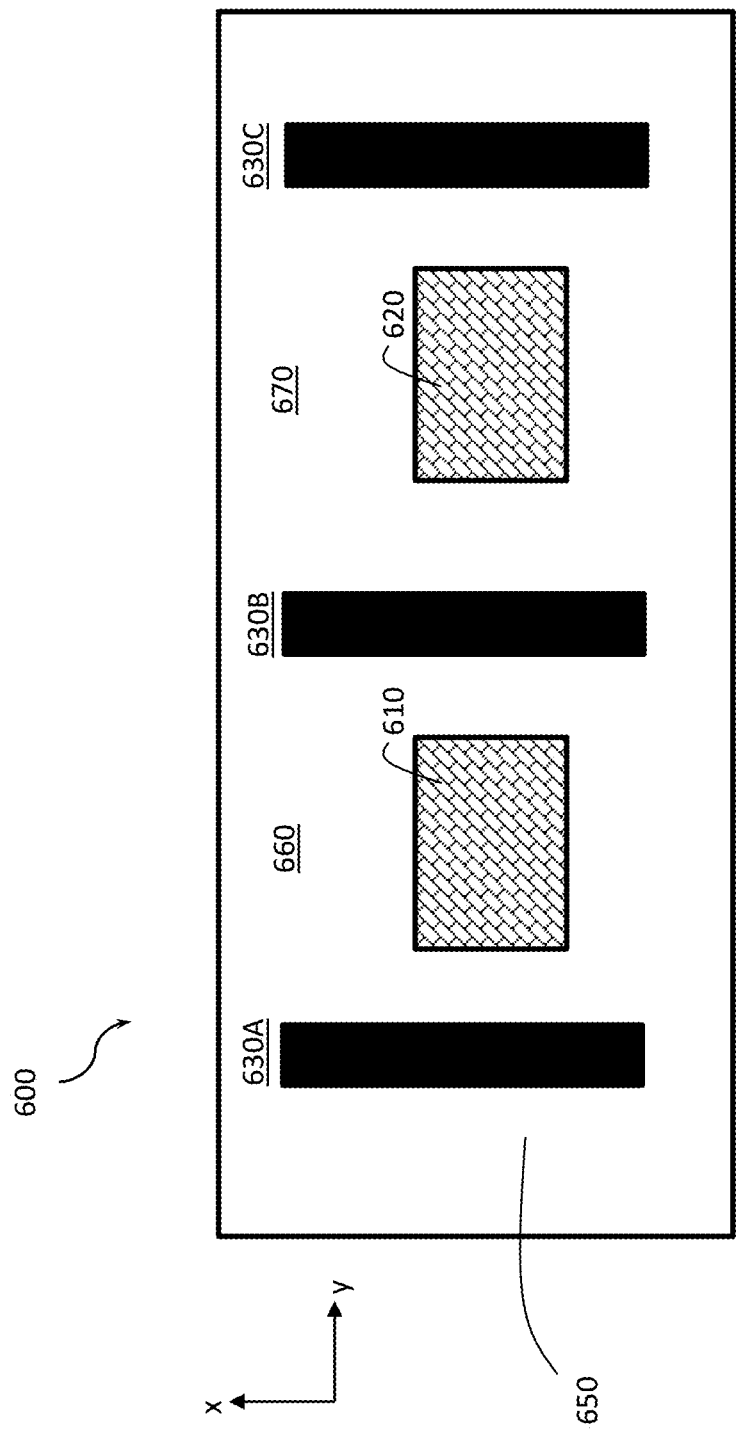
FIG. 6 is a top view of yet another example IC device including semiconductor devices isolated by BSRs, according to some embodiments of the disclosure.

FIG. 6 is a top view of yet another example IC device 600 including semiconductor devices 610 and 620 isolated by BSRs 630A-C, according to some embodiments of the disclosure. The IC device 600 may be an embodiment of the IC device 300 in FIG. 3. The semiconductor devices 610 and 620 may be the same as or similar to the semiconductor devices 310 and 320 in FIG. 3. The IC device 600 also includes a support structure 650. The support structure 650 may be the same as or similar to the support structure 350 in FIG. 3. The IC device 600 may include other components.

In the embodiment of FIG. 6, the BSRs 630A-C (collectively referred to as "BSRs 630" or "BSR 630") are separated from each other. Each BSR 630 has a rectangular cross-section in the x-y plane. In other embodiments, the BSRs 630 may have different shapes. A BSR 630 can be connected to a TSV, e.g., the TSV 340 in FIG. 3. The BSRs 630 are in parallel. As shown in FIG. 6, the BSRs 630 defines two sections 660 and 670 in the support structure 650. The section 660 is between the BSRs 630A and 630B. The section 670 is between the BSRs 630B and 630C. The semiconductor device 610 is in the section 660 and the semiconductor device 620 is in the section 670. With such as configuration, the semiconductor device 610 is isolated from the semiconductor device 620 by the BSRs 630. A BSR 630 includes an electrical insulator. In some embodiments, a BSR 630 may also include an electrical conductor. At least part of the electrical conductor is enclosed by the electrical insulator. The electrical insulator can insulate the electrical conductor from the semiconductor material in the support structure 650.

With the arrangement of the BSRs 630 in FIG. 6, the BSRs 630 may be used as BPRs to deliver power to a number of devices that are spread out over a large area of the support structure 650. A BSR 630 may have a sufficiently large length, e.g., along the direction perpendicular to the x-y plane, the resistance for lateral coupling through the support structure 650 (which may be a p-type substrate) around BSR 630 can be negligible and therefore, leads to an improved substrate noise isolation between the semiconductor devices 610 and 620.

Figure 7:
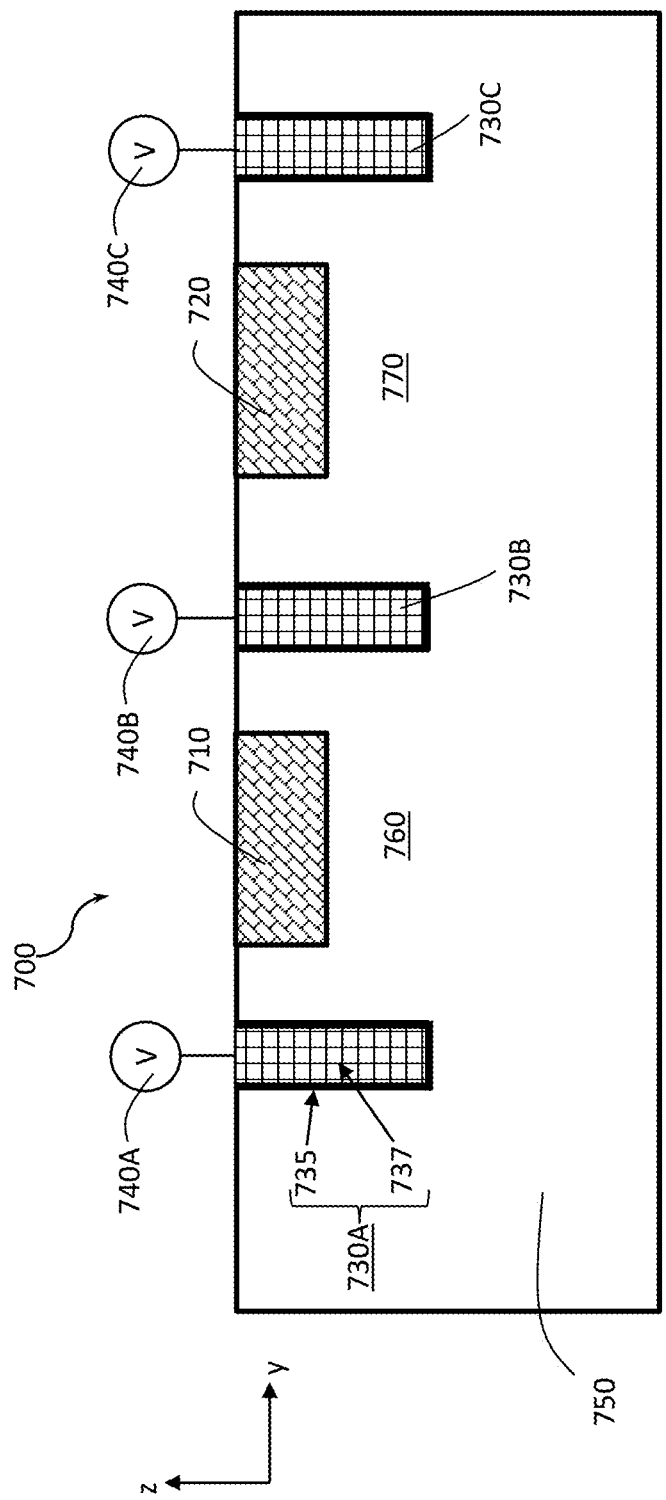
FIG. 7 is a cross-sectional of an example IC device including semiconductor devices isolated by biased BSRs, according to some embodiments of the disclosure.

FIG. 7 is a cross-sectional of an example IC device 700 including semiconductor devices 710 and 720 isolated by biased BSRs 730A-C, according to some embodiments of the disclosure. The semiconductor devices 710 and 720 may be the same as or similar to the semiconductor devices 310 and 320 in FIG. 3. The IC device 700 also includes a support structure 750, in which the semiconductor devices 710 and 720 and BSRs 730A-C (collectively referred to as "BSRs 730" or "BSR 730") are located, and power suppliers 740A-C (collectively referred to as "power suppliers 740" or "power supplier 740") that bias the BSRs 730A-C. The support structure 750 may be the same as or similar to the support structure 350 in FIG. 3. The IC device 700 may include other components.

In the embodiment of FIG. 7, the BSRs 730A-C are separated from each other. Each BSR 730 is biased by a power supplier 740. The power supplier 740 may be a power plane. Each BSR 730 has a rectangular cross-section in the y-z plane. In other embodiments, the BSRs 730 may have different shapes. As shown in FIG. 7, the BSRs 730 defines two sections 760 and 770 in the support structure 750. The section 760 is between the BSRs 730A and 730B. The section 770 is between the BSRs 730B and 730C. The semiconductor device 710 is in the section 760 and the semiconductor device 720 is in the section 770. With such a configuration, the semiconductor device 710 is isolated from the semiconductor device 720 by the BSRs 730. A BSR 730 includes an electrical insulator. In some embodiments, a BSR 730 may also include an electrical conductor. At least part of the electrical conductor is enclosed by the electrical insulator. The electrical insulator can insulate the electrical conductor from the semiconductor material in the support structure 750.

The BSRs 730 can be used in IC devices where frontside power delivery is implemented, which does not require the TSVs for power delivery. For instance, the IC device 700 has power and ground planes arranged at the frontside of the support structure 750. Due to the absence of TSVs, the BSRs 730 in FIG. 7 may not be able to lead to a full physical isolation between the semiconductor devices 710 and 720 over the full cross-section of the support structure 750, the biased BSRs 730 forms a depletion region in the support structure 750, which may be a p-type substrate that includes a p-type semiconductor material. The depletion region is electrically insulating. In other words, the biased BSRs 730 depletes charge carriers in the support structure 750. This effect can be stronger for a smaller distance from the biased BSRs 730. The charge carrier depletion can lead to a significant increase in substrate resistance and therefore, reduce substrate coupling.

Figure 8:
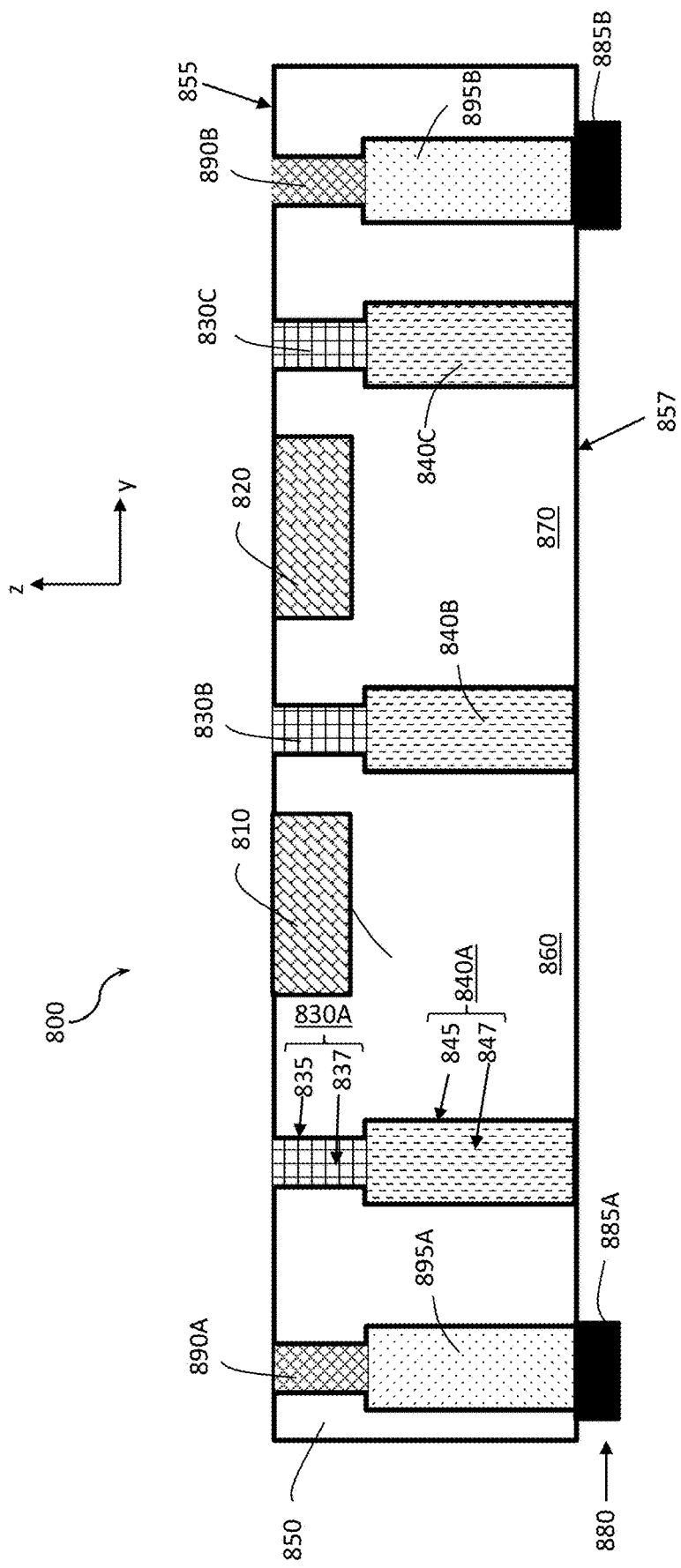
FIG. 8 is a cross-sectional of an example IC device including BSRs and BPRs, according to some embodiments of the disclosure.

FIG. 8 is a cross-sectional of an example IC device 800 including BSRs 830A-C and BPRs 890A-B, according to some embodiments of the disclosure. The IC device 800 also includes semiconductor devices 810 and 820, TSVs 840A-C, additional TSVs 895A-B, a support structure 850, and an electrically conductive layer 880. In other embodiments, the IC device 800 may include fewer, more, or different components. For instance, the IC device 800 may include one or more electrically conductive layers coupled to the semiconductor devices 810 and 820. The IC device 800 may be an embodiment of the IC device 300 in FIG. 3.

The semiconductor devices 810 and 820, BSRs 830A-C (collectively referred to as "BSRs 830" or "BSR 830"), TSVs 840A-C (collectively referred to as "TSVs 840" or "TSV 840"), BPRs 890A-B (collectively referred to as "BPRs 890" or "BPR 890"), and TSVs 895A-B (collectively referred to as "TSVs 895" or "TSV 895") are in the support structure 850. The semiconductor devices 810 and 820 may be the same as or similar to the semiconductor devices 310 and 320 in FIG. 3. The BSRs 830 may be the same as or similar to the BSRs 330 in FIG. 3. The TSVs 840 may be the same as or similar to the TSVs 340 in FIG. 3.

The support structure 850 includes a semiconductor material, such as silicon. The support structure 850 may be the same as or similar to the support structure 350 in FIG. 3. The support structure 850 includes two surfaces 855 and 857. The surface 857 opposes the surface 855. The semiconductor devices 810 and 820 are at the surface 855. The side of the support structure 850 from the surface 855 upwards is referred to as the frontside, and side of the support structure 850 from the surface 857 downwards is referred to as the backside of the support structure 850.

The BSRs 830 and TSVs 840 defines two sections 860 and 870 in the support structure 850. The semiconductor device 810 is in the section 860 and the semiconductor device 820 is in the section 870. The semiconductor device 810 is isolated from the semiconductor device 820 by the BSRs 830 and TSVs 340. In FIG. 8, the BSRs 830 are connected to the surface 855 of the support structure 850 and the TSVs 840 are connected to the surface 857 of the support structure 850. The BSRs 830 and TSVs 840 provide a full isolation of the two sections 860 and 870 of the support structure 850. In other embodiments, there may be a gap between a BSR 830 and the surface 855 or between a TSV 840 and the surface 857.

In the embodiment of FIG. 8, the BSRs 830 and TSVs 840 are not used for power delivery. Power delivery is facilitated by the BPRs 890 and TSVs 895 in the support structure 850. The BPRs 890 are separated and insulated from the BSRs 830. A BPR 890 includes a conducting core. The conductor core includes an electrical conductor, e.g., metal. The BPR 890 may also include an electrical insulator that functions as an insulating barrier between the conducting core and the semiconductor material of the support structure 850. Each BPR 890 is connected to a TSV 895. Similar to the BPR 890, the TSV 895 may include a conducting core and an insulating barrier. The conducting core of the TSV 895 is connected to the conductor core of the BPR 890 to form a conducting path. The TSVs 895 are connected to the electrically conductive layer 880 for backside power delivery. The BSRs 830 and BPRs 890 can be in parallel. The TSVs 840 and 895 can also be in parallel.

The electrically conductive layer 880 is a layer comprising an electrically conductive material, e.g., metal. The electrically conductive layer 880 include sections 885A-B (collectively referred to as "sections 885" or "section 885"). The sections 885 are insulated from each other. For instance, the electrically conductive layer 880 is enclosed in an insulator layer (not shown in FIG. 8), which is a layer comprising an electrically insulating material, such as an oxide material. The electrically insulation material separates and insulates the sections 885 from each other. Each section 885 is connected to a TSV 895. Accordingly, the BSRs 830 are coupled to the electrically conductive layer 880 by the TSVs 840. The electrically conductive layer 880 may be used to deliver power to the semiconductor devices 810 and 820 or other semiconductor devices associated with the IC device 800. For instance, the BPRs 890 are coupled to one or more semiconductor devices by vias. The electrically conductive layer 880 is, or is coupled to, a power or ground plane of the IC device 800. The BSRs 830, TSVs 840, and electrically conductive layer 880 forms a conducting path for backside delivery.

FIG. 8 shows backside power delivery by the BPRs 890 and TSVs 895. In other embodiments, the BPRs 890 can be used for frontside power delivery. For instance, the BPRs 890 may be coupled to an electrically conductive layer at the frontside of the support structure 850, e.g., by vias. The electrically conductive layer can be connected to the semiconductor devices 810 and 820 so that the BPRs 890 and electrically conductive layer can deliver power to the semiconductor devices 810 and 820.

Previously, we described the possibilities of BPR technology in enabling improved substrate isolation by creating locally isolated p-well regions. Having this approach available can additionally allow to skip the use of a deep n-well implant and, thereby, reducing the cost for the mask set. In the following, we show two exemplary use-cases to illustrate the proposal.

Figure 9:
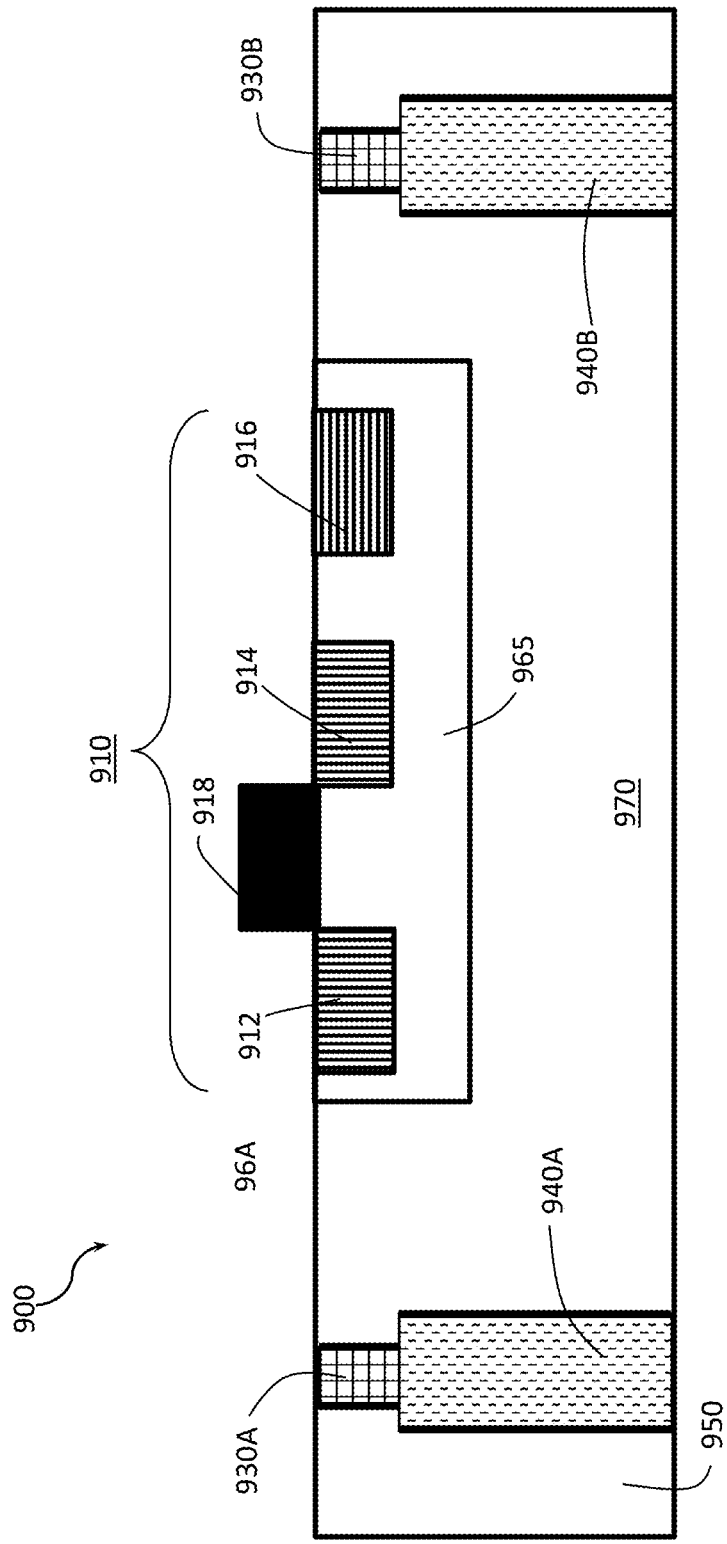
FIG. 9 is a cross-sectional view of an example IC device including a NMOS transistor isolated by BSRs and TSVs, according to some embodiments of the disclosure.

FIG. 9 is a cross-sectional view of an example IC device including a NMOS transistor 910 isolated by BSRs 930A-B and TSVs 940A-B, according to some embodiments of the disclosure. The IC device also includes a support structure 950. The support structure 950 includes a p-type semiconductor material and functions as a p-type substrate. The BSRs 930A-B (collectively referred to as "BSRs 930" or "BSR 930") and TSVs 940A-B (collectively referred to as "TSVs 940" or "TSV 940") are in the support structure 950. In other embodiments, the IC device 900 may include fewer, more, or different components. For instance, the IC device 900 may include power sources to bias the BSRs 930 and not include the TSVs 940. The IC device 900 may also include other types of transistors.

The NMOS transistor 910 includes semiconductor structures 912, 914, and 916. The NMOS transistor 910 also includes a gate 918 between the semiconductor structures 912 and 914. The semiconductor structures 912, 914, and 916 are in a section 970 inside the support structure 950, particularly in a p-well 965 in the section 970. The semiconductor structure 912 is an n-doped region, e.g., an n++ junction implant. The semiconductor structure 914 is also an n-doped region. The concentrations of n-type dopants in the semiconductor structures 912 and 914 are higher than the concentrations of n-type dopants in the p-well 965 outside the semiconductor structures 912 and 914 and higher than the concentration of n-type dopants in the section 970 outside the semiconductor structures 912 and 914. The semiconductor structure 916 is a p-doped region, e.g., a p++ junction implant. The concentration of one or more p-type dopants in the semiconductor structure 916 is higher than the concentration of p-type dopants in the p-well 965 outside the semiconductor structure 916. The concentration of p-type dopants in the p-well 965 is higher than the concentration of p-type dopants in the section 970 outside the semiconductor structure 916.

For high-frequency common-gate applications, such as for RF/mm-wave switches, the n++ junction diode is one of the weak spots during high power inputs as the diode into substrate might open and, therefore, lead to strong losses into the substrate. A common approach to secure this diode for high input power is to isolate the p-well 965 by having two n-wells on the right and left sides of the p-well 965, respectively and a deep n-well below the p-well 965. As the n-wells are on the sides of the p-well 965 and the deep n-well is below the p-well 965, the p-well 965 can be isolated. The p-well can be biased by a large resistance to achieve an RF-floating body.

In contrast, in the embodiment of FIG. 9, the p-well 965 is isolated by the BSRs 930 and TSVs 940. The BSRs 930 and TSVs 940 define boundaries of the section 970 in the support structure 950. The section 970 is between the BSR 930A-TSV 940A pair and the BSR 930B-TSV 940B pair. The semiconductor structures 912, 914, and 916 of the NMOS transistor 910 are inside the section 970. The coupling between the BSRs 930-TSV 940 pairs and the p-type semiconductor material in the support structure 950 forms serial capacitance that isolates the NMOS transistor 910. Accordingly, signals from the NMOS transistor 910 will not be transmitted outside the section 970. The BSRs 930 can be embodiments of the BSRs 330 in FIG. 3. The TSVs 940 can be embodiments of the TSVs 340 in FIG. 3. Thus, the IC device 900 does not need any n-wells or deep n-well to isolate the p-well 965, which can save the effort and cost of forming the n-wells and deep n-well in the support structure 950.

In some embodiments, the BSRs 930 are BPRs for delivering power to devices in the IC device 900. Also, the TSVs 940 can be used for backside power delivery. In these embodiments, the isolation of the NMOS transistor 910 does not require additional components, as the BPRs and TSVs will be needed for power delivery anyway. Moreover, in embodiments including stacked switches, the placement of BPR isolation trenches between each transistor instance's p-well can further improve the off-state characteristics by suppressing substrate noise between the input and output terminals.

Figure 10:
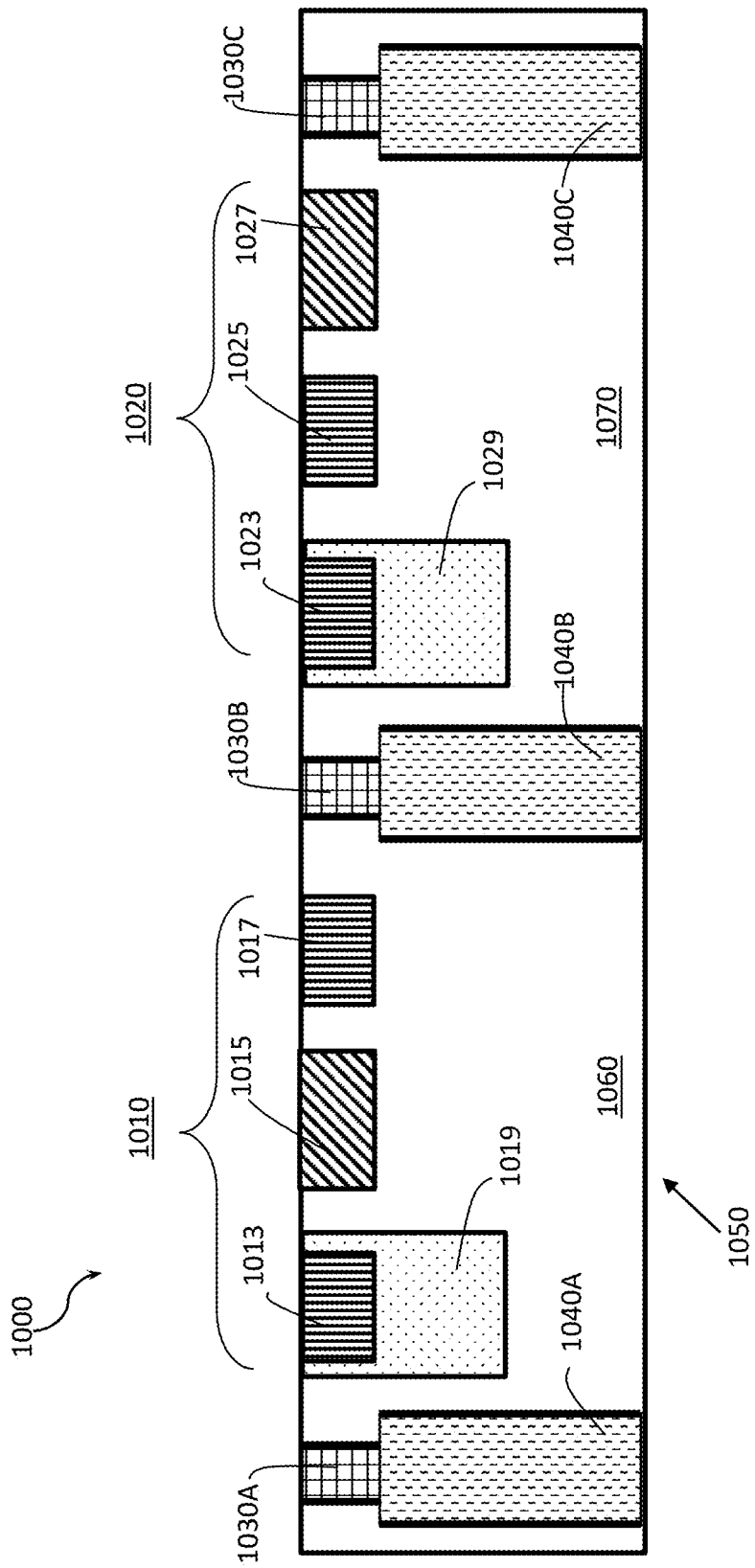
FIG. 10 is a cross-sectional view of another example IC device including bipolar transistors separated by BSRs and TSVs, according to some embodiments of the disclosure.

FIG. 10 is a cross-sectional view of another example IC device including bipolar transistors 1010 and 1020 isolated by BSRs 1030 and TSVs 1040, according to some embodiments of the disclosure. The IC device 1000 also includes a support structure 1050. The support structure 1050 includes a p-type semiconductor material and functions as a p-type substrate. The BSRs 1030A-B (collectively referred to as "BSRs 1030" or "BSR 1030") and TSVs 1040A-B (collectively referred to as "TSVs 1040" or "TSV 1040") are in the support structure 1050. In other embodiments, the IC device 1000 may include fewer, more, or different components. For instance, the IC device 1000 may include power sources to bias the BSRs 1030 and not include the TSVs 1040. The IC device 1000 may also include other types of transistors.

The bipolar transistor 1010 includes semiconductor structures 1013, 1015, 1017, and 1019. The semiconductor structures 1013, 1015, 1017, and 1019 are in the support structure 1050, particularly in a section 1060 of the support structure 1050. The semiconductor structure 1013 is an n-doped region. The semiconductor structure 1015 is a p-doped region. The semiconductor structure 1017 is an n-doped region. The semiconductor structure 1019 is an n-well and encloses the semiconductor structure 1013. The concentration of one or more n-type dopants in the semiconductor structure 1019 is higher than the concentration of n-type dopants in the section 1060 outside the semiconductor structure 1019. The concentrations of one or more n-type dopants in the semiconductor structure 1013 is higher than the concentration of n-type dopants in the semiconductor structure 1019 outside the semiconductor structure 1013. The concentrations of one or more p-type dopants in the semiconductor structure 1015 is higher than the concentration of p-type dopants in the section 1060 outside the semiconductor structure 1015. The concentrations of one or more n-type dopants in the semiconductor structure 1017 is higher than the concentration of n-type dopants in the section 1060 outside the semiconductor structure 1017 and may be higher than the concentration of n-type dopants in the semiconductor structure 1019 outside the semiconductor structure 1013. In one example, the semiconductor structures 1013 is a collector, the semiconductor structures 1015 is a base contact, and the semiconductor structures 1017 is an emitter. Thus, the base contact is between the emitter and collector in the bipolar transistor 1010.

The bipolar transistor 1020 includes semiconductor structures 1023, 1025, 1027, and 1029. The semiconductor structures 1023, 1025, 1027, and 1029 are in the support structure 1050, particularly in a section 1070 of the support structure 1050. The semiconductor structure 1023 is an n-doped region. The semiconductor structure 1025 is also an n-doped region. The semiconductor structure 1027 is a p-doped region. The semiconductor structure 1029 is an n-well and encloses the semiconductor structure 1023. The concentration of one or more n-type dopants in the semiconductor structure 1029 is higher than the concentration of n-type dopants in the section 1070 outside the semiconductor structure 1029. The concentrations of one or more n-type dopants in the semiconductor structure 1023 is higher than the concentration of n-type dopants in the semiconductor structure 1029 outside the semiconductor structure 1023. The concentrations of one or more n-type dopants in the semiconductor structure 1025 is higher than the concentration of n-type dopants in the section 1070 outside the semiconductor structure 1025 and may be higher than the concentration of n-type dopants in the semiconductor structure 1029 outside the semiconductor structure 1023. The concentrations of one or more p-type dopants in the semiconductor structure 1027 is higher than the concentration of p-type dopants in the section 1070 outside the semiconductor structure 1027. In one example, the semiconductor structures 1023 is a collector, the semiconductor structures 1025 is an emitter, and the semiconductor structures 1027 is a base contact. The emitter and collector are closer to each other in the bipolar transistor 1020, compared with the emitter and collector in bipolar transistor 1010.

The bipolar transistors 1010 and 1020 are isolated by the BSRs 1030 and TSVs 1040. The BSRs 1030 and TSVs 1040 defines boundaries of the sections 1060 and 1070 in the support structure 1050. A pair of a BSR and TSV forms a boundary of a section. As shown in FIG. 10, the section 1060 is between the pair of BSR 1030A and TSV 1034A and the pair of BSR 1030B and TSV 1034B. The section 1060 is between the pair of BSR 1030B and TSV 1034B and the pair of BSR 1030C and TSV 1034C. As the bipolar transistor 1010 is in the section 1060, the bipolar transistor 1010 is isolated by the BSRs 1030A-B and TSVs 1040A-B. Similarly, the bipolar transistor 1020 is isolated by the BSRs 1030B-C and TSVs 1040B-C. Accordingly, signals from a bipolar transistor would not be transmitted to the other bipolar transistor through the support structure 1050. FIG. 10 shows another example of using BSRs and TSVs to isolation transistors and to eliminate usage of deep n-wells.

Figure 11:
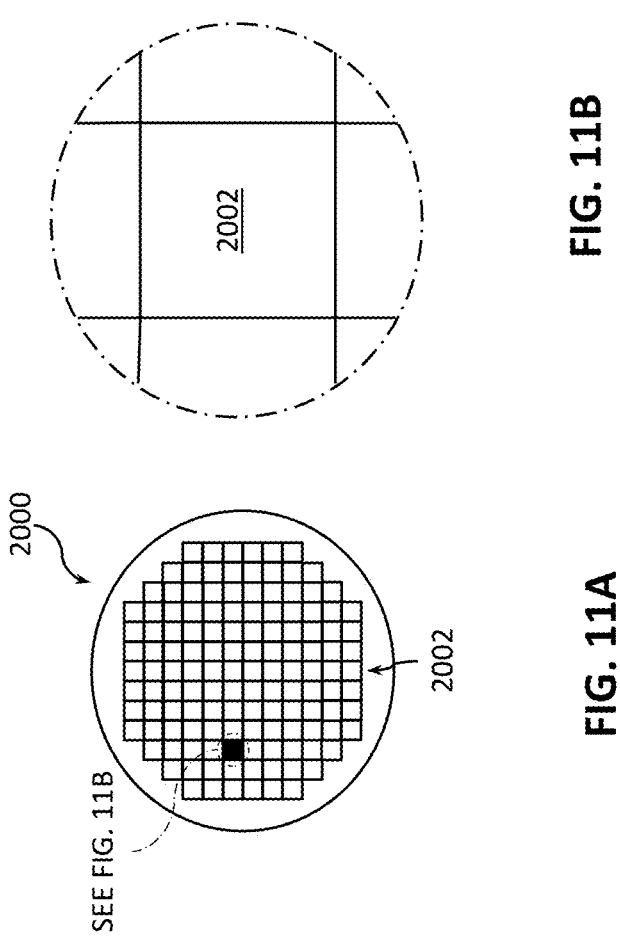
FIGS. 11A-11B are top views of a wafer and dies that may include semiconductor devices separated by BSRs, according to some embodiments of the disclosure.

FIGS. 11A-11B are top views of a wafer 2000 and dies 2002 that may include semiconductor devices separated by BSRs, according to some embodiments of the disclosure. In some embodiments, the dies 2002 may be included in an IC package, according to some embodiments of the disclosure. For example, any of the dies 2002 may serve as any of the dies 2256 in an IC package 2200 shown in FIG. 12. The wafer 2000 may be composed of semiconductor material and may include one or more dies 2002 having IC devices formed on a surface of the wafer 2000. Each of the dies 2002 may be a repeating unit of a semiconductor product that includes any suitable IC (e.g., ICs including one or more BPRs as described herein). After the fabrication of the semiconductor product is complete (e.g., after manufacture of one or more BPRs as described herein), the wafer 2000 may undergo a singulation process in which each of the dies 2002 is separated from one another to provide discrete "chips" of the semiconductor product. In particular, devices that include one or more BPRs as disclosed herein may take the form of the wafer 2000 (e.g., not singulated) or the form of the die 2002 (e.g., singulated). The die 2002 may include one or more diodes (e.g., one or more BPRs as described herein), one or more transistors (e.g., one or more III-N transistors as described herein) as well as, optionally, supporting circuitry to route electrical signals to the III-N diodes with n-doped wells and capping layers and III-N transistors, as well as any other IC components. In some embodiments, the wafer 2000 or the die 2002 may implement an electrostatic discharge (ESD) protection device, an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 12:
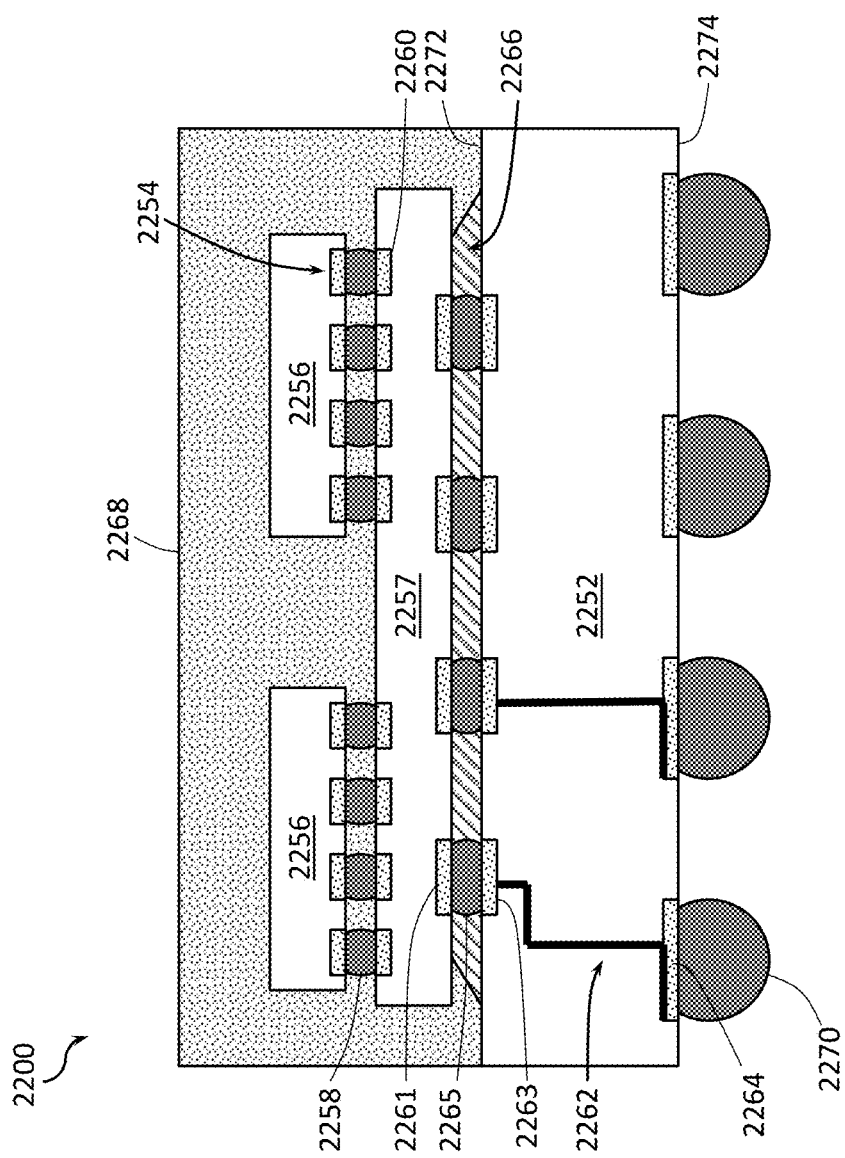
FIG. 12 is a side, cross-sectional view of an example IC package that may include one or more IC devices having semiconductor devices separated by BSRs, according to some embodiments of the disclosure.

FIG. 12 is a side, cross-sectional view of an example IC package 2200 that may include one or more IC devices having semiconductor devices separated by BSRs, according to some embodiments of the disclosure. In some embodiments, the IC package 2200 may be a system-in-package (SiP).

As shown in FIG. 12, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 12 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 12 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 12 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 13.

The dies 2256 may take the form of any of the embodiments of the die 2002 discussed herein and may include any of the embodiments of an IC device having one or more BPRs. In embodiments in which the IC package 2200 includes multiple dies 2256, the IC package 2200 may be referred to as a multi-chip package. Importantly, even in such embodiments of an MCP implementation of the IC package 2200, one or more BPRs may be provided in a single chip, in accordance with any of the embodiments described herein. The dies 2256 may include circuitry to perform any desired functionality. For example, one or more of the dies 2256 may be ESD protection dies, including one or more BPRs as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more BPRs, e.g., as discussed above; in some embodiments, at least some of the dies 2256 may not include any III-N diodes with n-doped wells and capping layers.

The IC package 2200 illustrated in FIG. 12 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 12, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 13:
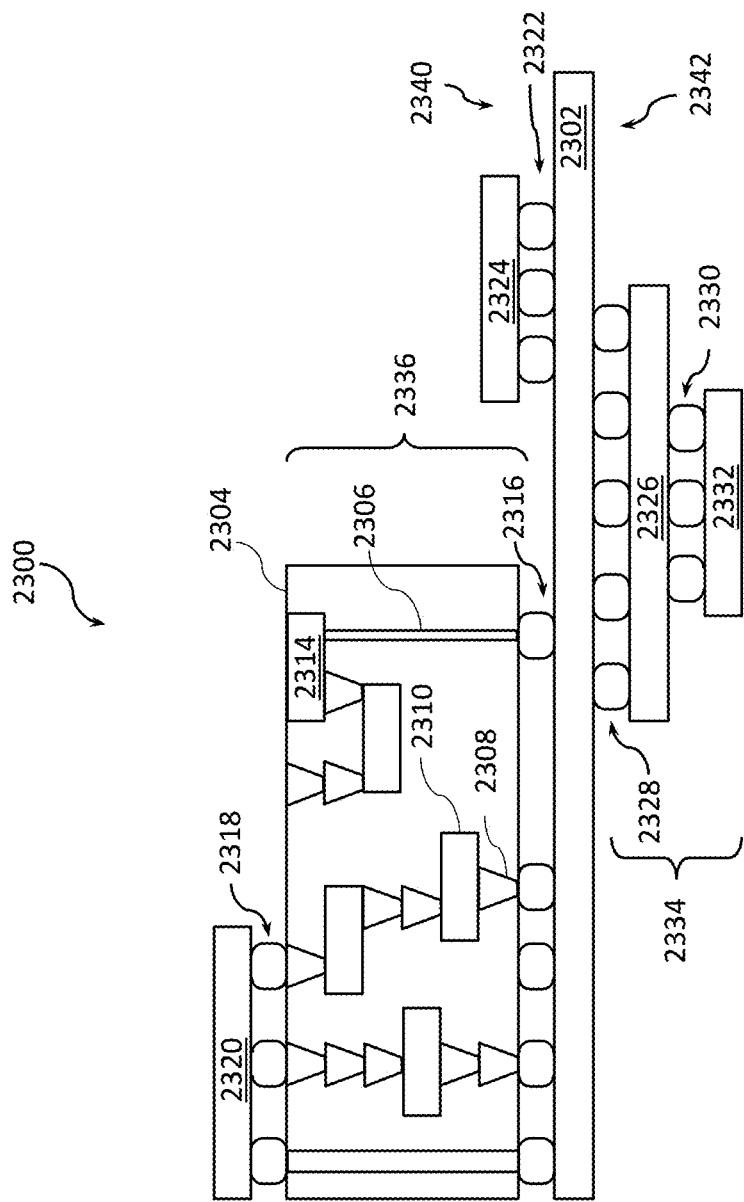
FIG. 13 is a cross-sectional side view of an IC device assembly that may include components having one or more IC devices implementing semiconductor devices separated by BSRs, according to some embodiments of the disclosure.

FIG. 13 is a cross-sectional side view of an IC device assembly 2300 that may include components having one or more IC devices implementing semiconductor devices separated by BSRs, according to some embodiments of the disclosure. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing one or more BPRs in accordance with any of the embodiments disclosed herein; e.g., any of the IC packages discussed below with reference to the IC device assembly 2300 may take the form of any of the embodiments of the IC package 2200 discussed above with reference to FIG. 12 (e.g., may include one or more BPRs in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 13 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 13), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 11B), an IC device (e.g., the IC device of FIGS. 1-2), or any other suitable component. In particular, the IC package 2320 may include one or more BPRs as described herein. Although a single IC package 2320 is shown in FIG. 13, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 13, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing one or more BPRs as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 13 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 14:
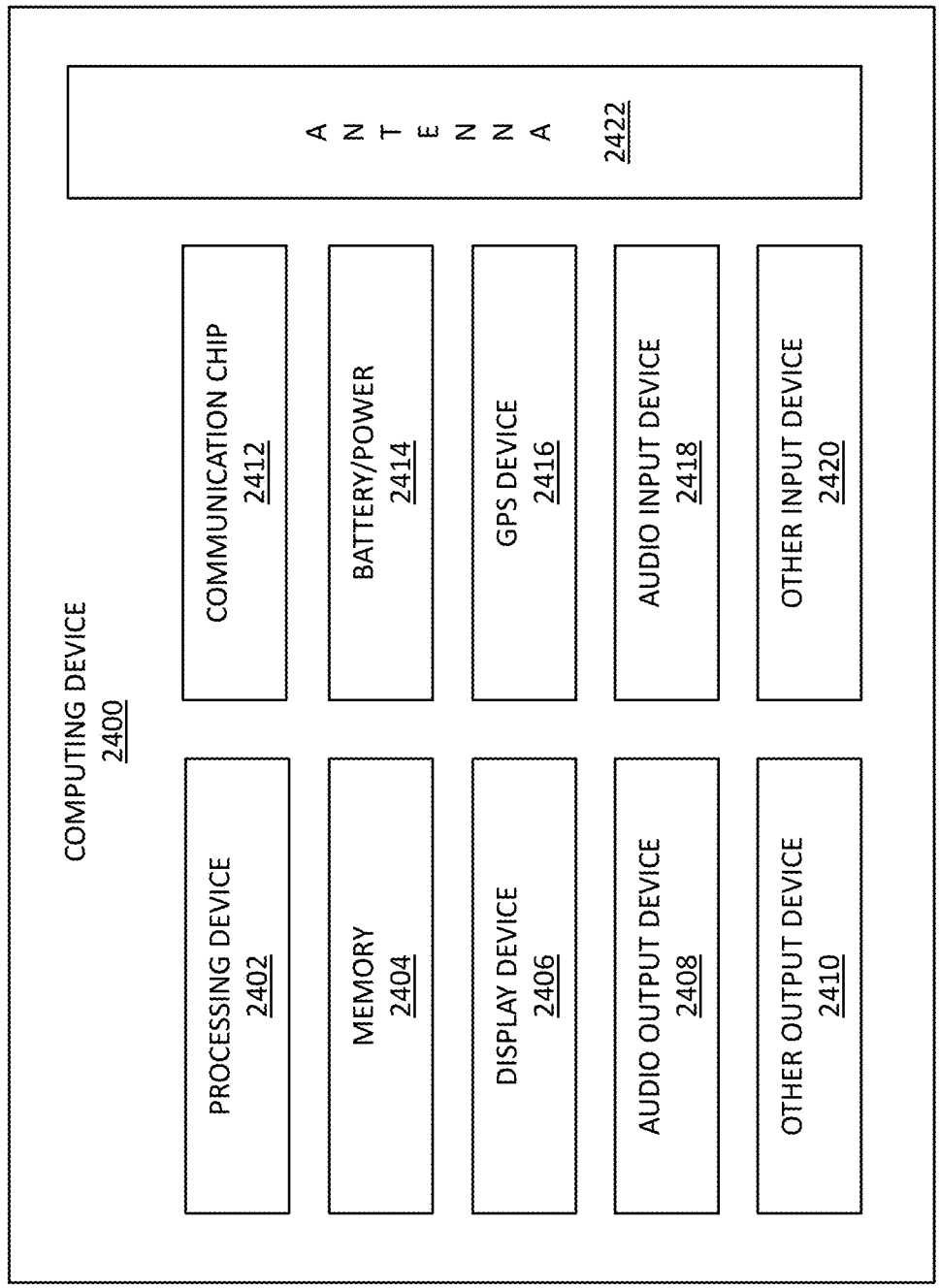
FIG. 14 is a block diagram of an example computing device that may include one or more components with semiconductor devices separated by BSRs, according to some embodiments of the disclosure.

FIG. 14 is a block diagram of an example computing device 2400 that may include one or more components with one or more IC devices having one or more BPRs, according to some embodiments of the disclosure. For example, any suitable ones of the components of the computing device 2400 may include a die (e.g., the die 2002 of FIG. 11B) including one or more BPRs, according to some embodiments of the disclosure. Any of the components of the computing device 2400 may include an IC device (e.g., any embodiment of the IC devices of FIGS. 1-4) and/or an IC package (e.g., the IC package 2200 of FIG. 12). Any of the components of the computing device 2400 may include an IC device assembly (e.g., the IC device assembly 2300 of FIG. 13).

A number of components are illustrated in FIG. 14 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 14, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC devices having one or more BPRs as described herein may be particularly advantageous for use as part of ESD circuits protecting power amplifiers, low-noise amplifiers, filters (including arrays of filters and filter banks), switches, or other active components. In some embodiments, IC devices having one or more BPRs as described herein may be used in PMICs, e.g., as a rectifying diode for large currents. In some embodiments, IC devices having one or more BPRs as described herein may be used in audio devices and/or in various input/output devices.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

Example 1 provides an IC device, including: a support structure; a first structure in the support structure, where the first structure includes a first electrical insulator and has a ring shape; a second structure inside the support structure, where the second structure includes a second electrical insulator and has a ring shape; a first semiconductor device at least partially in the support structure, where the first semiconductor device is at least partially enclosed by the first structure; and a second semiconductor device at least partially in the support structure, where the second semiconductor device is at least partially enclosed by the second structure, and the second semiconductor device is different from the first semiconductor device.

Example 2 provides the IC device according to example 1, further including: a layer including an electrically conductive material; and a buried power rail at least partially in the support structure, where the buried power rail is coupled to the layer and the first semiconductor device or the second semiconductor device.

Example 3 provides the IC device according to example 1 or 2, where the support structure includes a semiconductor material, the first semiconductor device includes a portion of the semiconductor material, and the second semiconductor device includes another portion of the semiconductor material.

Example 4 provides the IC device according to any of the preceding examples, where the first semiconductor device includes a first bipolar transistor, and the second semiconductor device includes a second bipolar transistor that is different from the first bipolar transistor.

Example 5 provides the IC device according to any of the preceding examples, where the first structure is connected to the second structure.

Example 6 provides the IC device according to any of the preceding examples, where the first structure includes an electrical conductor, at least a portion of the first electrical conductor is in contact with the first electrical insulator, and the electrical conductor is coupled to a power plane of the IC device.

Example 7 provides the IC device according to example 6, where the second structure includes an additional electrical conductor, at least a portion of the additional electrical conductor is in contact with the second electrical insulator, and the additional electrical conductor is coupled to a ground plane of the IC device.

Example 8 provides the IC device according to any of the preceding examples, where the support structure has a first surface and a second surface opposing the first surface, and the first structure is between the first surface and the second surface.

Example 9 provides the IC device according to any of the preceding examples, where the first semiconductor device includes a first analog circuit, and the second semiconductor device includes a second analog circuit that is different from the first analog circuit.

Example 10 provides the IC device according to example 9, where the first and second semiconductor devices are components of a radio-frequency transmitter.

Example 11 provides an IC device, including: a support structure including a first section and a second section, the support structure having a first surface and a second surface opposing the first surface; a first semiconductor device at least partially in the first section; a second semiconductor device at least partially in the second section; and a structure including an electrical insulator, where the structure is buried in the support structure, the structure extends from the first surface to the second surface, the first section is enclosed by a first portion of the structure, and the second section is enclosed by a second portion of the structure.

Example 12 provides the IC device according to example 11, where the structure includes: a buried power rail including an electrical conductor that is at least partially enclosed by a first portion of the electrical insulator, and a via including an electrical conductor that is at least partially enclosed by a second portion of the electrical insulator, where the buried power rail is connected to the via.

Example 13 provides the IC device according to example 12, where the buried power rail adjoins the first surface, and the via adjoins the second surface.

Example 14 provides the IC device according to example 12 or 13, where the buried power rail is coupled to a power plane or ground plane of the IC device.

Example 15 provides the IC device according to any one of examples 12-14, where the buried power rail is coupled to the first or second semiconductor device.

Example 16 provides an IC device, including: a support structure; a first structure buried in the support structure and including a first electrical insulator; a second structure buried in the support structure and including a second electrical insulator; a third structure buried in the support structure and including a third electrical insulator; a first semiconductor device at least partially in the support structure, where the first semiconductor device is between the first structure and the second structure; a second semiconductor device at least partially in the support structure, where the second semiconductor device is between the second structure and the third structure; and a first buried power rail and a second buried power rail, where the first structure, the second structure, and the third structure are between the first buried power rail and the second buried power rail.

Example 17 provides the IC device according to example 16, where: the first semiconductor device includes a sequence of a first n-doped semiconductor, a p-doped semiconductor, and a second n-doped semiconductor, and concentrations of dopants in the first n-doped semiconductor, the p-doped semiconductor, and the second n-doped semiconductor are higher than concentrations of the dopants in the first section outside the first n-doped semiconductor, the p-doped semiconductor, and the second n-doped semiconductor.

Example 18 provides the IC device according to example 17, where: the second semiconductor device includes a sequence of a first n-doped semiconductor, a second n-doped semiconductor, and a p-doped semiconductor, and concentrations of dopants in the first n-doped semiconductor, the second n-doped semiconductor, and the p-doped semiconductor are higher than concentrations of the dopants in the second section outside the first n-doped semiconductor, the second n-doped semiconductor, and the p-doped semiconductor.

Example 19 provides the IC device according to example 17 or 18, where: the first n-doped semiconductor of the first semiconductor device is enclosed in a n-well in the support structure, a concentration of a n-type dopant in the n-well is higher than the concentration of the n-type dopant in the support structure outside the n-well, and a concentration of the n-type dopant in the first n-doped semiconductor of the first semiconductor device is higher than the concentration of the n-type dopant in the n-well outside the first n-doped semiconductor of the first semiconductor device.

Example 20 provides the IC device according to any one of examples 16-19, where the first buried power rail, the second buried power rail, the first structure, the second structure, and the third structure are in parallel.

Example 21 provides an IC package, including the IC device according to any of the proceeding examples; and a further IC component, coupled to the IC device.

Example 22 provides the IC package according to example 21, where the further IC component includes one of a package substrate, an interposer, or a further IC die.

Example 23 provides the IC package according to example 21 or 22, where the IC device according to any one of examples 1-20 may include, or be a part of, at least one of a memory device, a computing device, a wearable device, a handheld electronic device, and a wireless communications device.

Example 24 provides a n electronic device, including a carrier substrate; and one or more of the IC devices according to any one of examples 1-20 and the IC package according to any one of examples 21-23, coupled to the carrier substrate.

Example 25 provides the electronic device according to example 24, where the carrier substrate is a motherboard.

Example 26 provides the electronic device according to example 24, where the carrier substrate is a PCB.

Example 27 provides the electronic device according to any one of examples 24-26, where the electronic device is a wearable electronic device or handheld electronic device.

Example 28 provides the electronic device according to any one of examples 24-27, where the electronic device further includes one or more communication chips and an antenna.

Example 29 provides the electronic device according to any one of examples 24-28, where the electronic device is an RF transceiver.

Example 30 provides the electronic device according to any one of examples 24-28, where the electronic device is one of a switch, a power amplifier, a low-noise amplifier, a filter, a filter bank, a duplexer, an upconverter, or a downconverter of an RF communications device, e.g., of an RF transceiver.

Example 31 provides the electronic device according to any one of examples 24-30, where the electronic device is a computing device.

Example 32 provides the electronic device according to any one of examples 24-31, where the electronic device is included in a base station of a wireless communication system.

Example 33 provides the electronic device according to any one of examples 24-31, where the electronic device is included in a user equipment device of a wireless communication system.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a support structure;
a first structure in the support structure, wherein the first structure includes a first electrical insulator and has a ring shape;
a second structure inside the support structure, wherein the second structure includes a second electrical insulator and has a ring shape;
a first semiconductor device at least partially in the support structure, wherein the first semiconductor device is at least partially enclosed by the first structure;
a second semiconductor device at least partially in the support structure, wherein the second semiconductor device is at least partially enclosed by the second structure, and the second semiconductor device is different from the first semiconductor device; and
a buried power rail, the buried power rail separated from the first structure and second structure by one or more electrical insulators.

2. The IC device according to claim 1, further comprising:
a layer comprising an electrically conductive material;
wherein the buried power rail is at least partially in the support structure, wherein the buried power rail is coupled to the layer and the first semiconductor device or the second semiconductor device.

3. The IC device according to claim 1, wherein the support structure comprises a semiconductor material, the first semiconductor device comprises a portion of the semiconductor material, and the second semiconductor device comprises another portion of the semiconductor material.

4. The IC device according to claim 1, wherein the first semiconductor device comprises a first bipolar transistor, and the second semiconductor device comprises a second bipolar transistor that is different from the first bipolar transistor.

5. The IC device according to claim 1, wherein the first structure is connected to the second structure.

6. The IC device according to claim 1, wherein the first structure comprises an electrical conductor, at least a portion of the first electrical conductor is in contact with the first electrical insulator, and the electrical conductor is coupled to a power plane of the IC device.

7. The IC device according to claim 6, wherein the second structure comprises an additional electrical conductor, at least a portion of the additional electrical conductor is in contact with the second electrical insulator, and the additional electrical conductor is coupled to a ground plane of the IC device.

8. The IC device according to claim 1, wherein the support structure has a first surface and a second surface opposing the first surface, and the first structure is between the first surface and the second surface.

9. The IC device according to claim 1, wherein the first semiconductor device comprises a first analog circuit, and the second semiconductor device comprises a second analog circuit that is different from the first analog circuit.

10. The IC device according to claim 9, wherein the first and second semiconductor devices are components of a radio-frequency transmitter.

* * * * *